United States Patent
Kelley et al.

(10) Patent No.: US 9,250,327 B2
(45) Date of Patent: Feb. 2, 2016

(54) METHOD AND APPARATUS FOR REDUCING SATELLITE POSITION MESSAGE PAYLOAD BY ADAPTIVE DATA COMPRESSION TECHNIQUES

(71) Applicant: SubCarrier Systems Corporation, Glendora, CA (US)

(72) Inventors: David Charles Kelley, Glendora, CA (US); Gregory John Berchin, Lake Saint Louis, MO (US)

(73) Assignee: SubCarrier Systems Corporation, Glendora, CA (US)

( * ) Notice: Subject to any disclaimer, the term of this patent is extended or adjusted under 35 U.S.C. 154(b) by 150 days.

(21) Appl. No.: 13/785,514

(22) Filed: Mar. 5, 2013

(65) Prior Publication Data
US 2014/0253369 A1 Sep. 11, 2014

(51) Int. Cl.
G01S 19/07 (2010.01)
G01S 19/41 (2010.01)
H03M 7/30 (2006.01)
G01S 19/00 (2010.01)

(52) U.S. Cl.
CPC . *G01S 19/07* (2013.01); *H03M 7/30* (2013.01)

(58) Field of Classification Search
CPC ......... G01S 19/01; G01S 19/03; G01S 19/07; G01S 19/36; G01S 19/39; G01S 19/40; G01S 19/41; H03M 7/30
USPC .............. 342/175, 195, 350, 352, 353, 357.2, 342/357.39, 357.4, 357.47, 357.48, 358, 342/385, 357.21–357.25, 357.31, 357.44; 375/211–215, 219–236, 240–240.17; 341/50, 63; 370/229, 235, 236, 239, 370/240, 241, 252; 382/232, 233, 239; 701/400, 408, 468–471; 708/100, 200, 708/203
See application file for complete search history.

(56) References Cited

U.S. PATENT DOCUMENTS

| | | | | |
|---|---|---|---|---|
| 3,697,875 A | * | 10/1972 | Guanella | 375/230 |
| 4,812,991 A | | 3/1989 | Hatch | |
| 4,963,889 A | | 10/1990 | Hatch | |
| 5,148,179 A | | 9/1992 | Allison | |
| 5,225,842 A | | 7/1993 | Brown et al. | |
| 5,282,224 A | * | 1/1994 | Harada | 375/224 |

(Continued)

OTHER PUBLICATIONS

Gerald L. Mader, et al., "Using Interpolation and Extrapolation Techniques to Yield High Data Rates and Ionoshpere Delay Estimates from Continuously Operating GPS Networks," pp. 2342-2348, ION GPS 2002, Sep. 24-27, 2002, Portland, OR.

(Continued)

*Primary Examiner* — Bernarr Gregory
(74) *Attorney, Agent, or Firm* — Robert Plotkin, P.C.; Robert Plotkin

(57) ABSTRACT

An adaptive method by which Differential GNSS corrections may be compressed. Each measurement datum to be transmitted to a rover for satellite navigation purposes is decomposed into two parts, namely, an anchor value and a delta value, and in some instances an added third part termed a nonce value is used. Encoding parameters such as the number of bits assigned to each part of the measurement datum, the order of the models used to convey positional data, and scaling constants in the models, are adjusted adaptively based on changing data and/or transmission medium characteristics. Adaptive compression also allows for anomalous conditions such as out-of-range data values to be handled gracefully.

35 Claims, 5 Drawing Sheets

(56) References Cited

U.S. PATENT DOCUMENTS

| | | | |
|---|---|---|---|
| 5,323,322 A | 6/1994 | Mueller et al. | |
| 5,376,968 A * | 12/1994 | Wu et al. | 375/240.14 |
| 5,379,224 A | 1/1995 | Brown et al. | |
| 5,442,363 A | 8/1995 | Remondi | |
| 5,471,217 A | 11/1995 | Hatch et al. | |
| 5,477,228 A | 12/1995 | Tiwari et al. | |
| 5,477,458 A | 12/1995 | Loomis | |
| 5,523,763 A * | 6/1996 | Loomis | G01S 19/41 342/357.44 |
| 5,602,741 A | 2/1997 | Talbot et al. | |
| 5,701,302 A * | 12/1997 | Geiger | 375/240 |
| 5,717,716 A * | 2/1998 | Doyle | 375/232 |
| 5,745,075 A | 4/1998 | Enge et al. | |
| 5,757,646 A | 5/1998 | Talbot et al. | |
| 5,862,177 A * | 1/1999 | Cummings et al. | 375/224 |
| 5,884,220 A * | 3/1999 | Farmer | G01S 19/41 342/357.44 |
| 5,890,091 A | 3/1999 | Talbot et al. | |
| 5,892,847 A * | 4/1999 | Johnson | 382/232 |
| 5,899,957 A | 5/1999 | Loomis | |
| 5,903,654 A | 5/1999 | Milton et al. | |
| 5,920,593 A * | 7/1999 | Perl et al. | 375/222 |
| 5,935,194 A | 8/1999 | Talbot et al. | |
| 5,945,933 A * | 8/1999 | Kalkstein | 341/63 |
| 5,973,639 A * | 10/1999 | Biacs | G01S 19/41 342/357.31 |
| 6,002,363 A | 12/1999 | Krasner | |
| 6,016,117 A | 1/2000 | Nelson, Jr. | |
| 6,091,773 A | 7/2000 | Sydorenko | |
| 6,229,478 B1 | 5/2001 | Biacs et al. | |
| 6,268,824 B1 | 7/2001 | Zhodzishky et al. | |
| 6,313,787 B1 | 11/2001 | King et al. | |
| 6,324,473 B1 | 11/2001 | Eschenbach | |
| 6,400,760 B1 * | 6/2002 | Gu et al. | 375/232 |
| 6,429,811 B1 * | 8/2002 | Zhao | H03M 7/30 701/468 |
| 6,437,734 B1 | 8/2002 | McBurney et al. | |
| 6,879,283 B1 | 4/2005 | Bird et al. | |
| 6,882,314 B2 | 4/2005 | Zimmerman et al. | |
| 6,934,632 B2 | 8/2005 | Hatch | |
| 6,961,018 B2 | 11/2005 | Heppe et al. | |
| 7,020,555 B1 | 3/2006 | Janky et al. | |
| 7,143,191 B2 | 11/2006 | Chuah et al. | |
| 7,248,211 B2 | 7/2007 | Hatch et al. | |
| 7,378,992 B2 | 5/2008 | Fallon | |
| 7,397,850 B2 * | 7/2008 | Easley et al. | 375/240 |
| 7,519,383 B2 * | 4/2009 | Olgaard | 375/224 |
| 7,579,984 B2 | 8/2009 | Wang et al. | |
| 7,586,438 B1 | 9/2009 | Lawrence et al. | |
| 7,623,067 B2 | 11/2009 | Raman et al. | |
| 7,639,739 B2 * | 12/2009 | Rose et al. | 375/240.01 |
| 7,679,555 B2 | 3/2010 | Dai et al. | |
| 7,711,480 B2 | 5/2010 | Robbins | |
| 7,714,747 B2 | 5/2010 | Fallon | |
| 7,746,802 B2 * | 6/2010 | Suh et al. | 370/252 |
| 7,751,974 B2 | 7/2010 | Brodie et al. | |
| 7,898,472 B2 | 3/2011 | Zeng | |
| 7,961,141 B2 | 6/2011 | Dai et al. | |
| 7,982,667 B2 | 7/2011 | Vollath et al. | |
| 7,991,044 B1 * | 8/2011 | Brown et al. | 375/226 |
| 8,004,462 B2 | 8/2011 | LaMance et al. | |
| 8,007,085 B2 | 8/2011 | Silverbrook et al. | |
| 8,031,111 B2 | 10/2011 | Ferguson et al. | |
| 8,077,085 B2 | 12/2011 | Huang | |
| 8,085,175 B2 * | 12/2011 | Velazquez | 375/233 |
| 8,085,196 B2 | 12/2011 | Whitehead | |
| 8,107,524 B2 * | 1/2012 | Laksono | 375/240.01 |
| 8,125,382 B2 | 2/2012 | Derbez et al. | |
| 8,130,143 B2 | 3/2012 | Liu et al. | |
| 8,134,497 B2 | 3/2012 | Janky et al. | |
| 8,134,499 B2 | 3/2012 | Wang et al. | |
| 8,174,437 B2 | 5/2012 | Whitehead | |
| 8,213,368 B2 * | 7/2012 | Hui et al. | 375/240 |
| 8,233,556 B2 * | 7/2012 | Waters et al. | 375/231 |
| 8,242,953 B2 | 8/2012 | Dai et al. | |
| 8,242,956 B2 | 8/2012 | LaMance et al. | |
| 8,259,008 B2 | 9/2012 | Farmer et al. | |
| 8,264,404 B2 | 9/2012 | Remondi et al. | |
| 8,271,194 B2 | 9/2012 | Whitehead et al. | |
| 8,428,113 B1 * | 4/2013 | Katic et al. | 375/232 |
| 8,638,845 B2 * | 1/2014 | Hatakawa et al. | 375/240 |
| 8,819,110 B2 * | 8/2014 | Jin | 370/236 |
| 8,879,672 B2 * | 11/2014 | Jung et al. | 375/224 |
| 2002/0126046 A1 | 9/2002 | Counselman, III et al. | |
| 2003/0142656 A1 | 7/2003 | Padovani et al. | |
| 2004/0145518 A1 | 7/2004 | Toda et al. | |
| 2005/0002481 A1 | 1/2005 | Woo et al. | |
| 2005/0110676 A1 | 5/2005 | Heppe et al. | |
| 2005/0146461 A1 | 7/2005 | Pande et al. | |
| 2007/0252758 A1 | 11/2007 | Loomis | |
| 2008/0036655 A1 | 2/2008 | Pitt et al. | |
| 2008/0191936 A1 | 8/2008 | Phatak | |
| 2009/0167599 A1 * | 7/2009 | Johnson et al. | 342/357.48 |
| 2010/0161568 A1 | 6/2010 | Xiao | |
| 2010/0231448 A1 | 9/2010 | Harper | |
| 2011/0169689 A1 | 7/2011 | Wang | |
| 2012/0236907 A1 | 9/2012 | Branch | |
| 2013/0335266 A1 | 12/2013 | Vollath | |
| 2015/0301189 A1 | 10/2015 | Berchin | |

OTHER PUBLICATIONS

Mojtaba Bhrami, et al., "A Kalman Filter-based Doppler-smoothing of Code Pseudoranges in GNSS-Challenged Environments," pp. 2362-2372, 24th International Technical Meeting of the Satellite Division the Institute of Navigation, Portland, OR, Sep. 19-23, 2011.
National Aeronautics and Space Administration Gooddard Space Flight Center, "Gravity Recovery and Climate Experiment (GRACE)," 2 page paper printed Nov. 30, 2012.
PCT Notification of Transmittal of the International Search Report and the Written Opinion of the International Searching Authority, or the Declaration, mailing date Mar. 11, 2014.
Radio Technical Commission for Maritime Services, Developed by RTCM Committee No. 104, "RTCM Standard 10401.2 for Differential Navstar GPS Reference Stations and Integrity Monitors (RSIM)," pp. 1-114, Dec. 18, 2006.
Radio Technical Commission for Maritime Services, Developed by RTCM Committee No. 104, "RTCM Standard 10410.1 Networked Transport of RTCM via Internet Protocol (Ntrip)—Version 2.0," 36 pages, Jun. 28, 2011.
Radio Technical Commission for Maritime Services—Developed by RTCM Special Committee No. 104, RTCM Standard 10403.1 Differential GNSS (Global Navigation Satellite Systems) Services—Version 3, 208 pages Jul. 1, 2011.
Radio Technical Commission for Maritime Serives—Developed by RTCM Special Committee No. 104, RTCM 10402.3 Recommended Standards for Differential GNSS (Global Navigation Satellite Systems) Services, 194 pages. Aug. 20, 2001.
Mark Schenewerk, "A Brief Review of Basic GPS Orbit Interpolation Strategies", GPS Solutions (2003) 6:265-267, published online: Nov. 9, 2002.
Nikolaj Popv and Tudor Jeblean, "A complete Method for Algorithm Validation" Research Institute for Sumbolic Computation, Johannes Kepler University, Linz, Austria, 5 pages website printout Nov. 30, 2012.
Gordon K. Smyth, "Polynomical Approximation" Encyclopedia of Biostatistics (ISBN 0471 975761), 13 pages 1998.
Geoffrey Blewitt, "Basics of the GPS Technique: Observation Equations"; Department of Geomatics, University of Newcastle, pp. 1-46, 1997.
Ghangho Kim, Sanghoon Jeon, Chongwon Kim, Deokhwa Han, Changdon Kee, Sujin Choi; "A Combined Numerial-Empirial Orbit Propagation Algorithm for Satellite Tracking and Backup Navigation System", pp. 812-819, International Technical Meeting (ITM) of the Institute of Navigation, Newport Beach, CA. Jan. 30-Feb. 1, 2012.
Mojtaba Bhrami and Marek Ziebart, "A Kalman Filter-based Doppler-smoothing of Code Pseudoranges in GNSS-Challenged Environments", pp. 2362-2372, 24th International Technical Meeting of the Satellite Division of the Institute of Navigation, Portland OR, Sep. 19-23, 2011.

(56) References Cited

OTHER PUBLICATIONS

Xin-Xiang Jin, "Algorithum for Carrier Adjusted DGPS Positioning", Delft Geodetic Computing Centre Faculty of Geodetic Engineering Delft University of Technology, 10 pages 1996.

Masayuki Saito, Yuki Sato, Masakazu Miya, Mitsuhide Shima, Yuji Omura, Junichi Takiguchi, Koki Asari; "Centimeter-class Augmentation System Utilizing Quasi-Zenith Satellite System", pp. 1243-1253, 24th International Technical Meeting of the Satellite Division of the Institute of Navigation, Portland, OR, Sep. 19-23, 2011.

Aubrey Chen, Tood Walter, Per Enge, "Combination of WASS and Klobuchar Ionospheric Corrections for non-Aviation Applications", pp. 617-623, Proceeding of the IAIN World Congress in Associates with U.S. ION Annual Meeting, Jun. 26-28, 2000, San Diego, CA.

Gethin Roberts, Emily Cosser, Xiaolin Meng, Alan Dodson, "Creating Virtual L2 GPS Data Using a Combination of L1 Receivers and L1/L2 Reference Receivers", pp. 1408-1413, ION GPS 2002, Sep. 24-27, 2002, Portland, OR.

Paula Korvenoja, Robert Piche, "Efficient Satellite Orbit Approximation", pp. 1930-1937, ION GPS 2000, Sep. 19-22, 2000, Salt Lake City, UT.

Sunil B. Bisnath,"Efficient, automated Cycle-Slip Correction of Dual-Frequency Kinematic GPS Data", pp. 145-154, ION GPS 2000, Sep. 19-22, 2000, Salt Lake City, UT.

Paul Collins, "Isolating and Estimating Undifferenced GPS Integer Ambiguities" pp. 720-732, ION NTM 2008, Jan. 28-30, 2008, San Diego, CA.

Peter Kielland, Tony Tubman, "On Estimating Map Model Errors and GPS Position Errors (Applying More Science to the Art of Navigation)", pp. 869-881, Proceedings of the 1994 National Technical Meeting of the Institute of Navigation, Jan. 24-26, 1994, San Diego, CA.

J.Arnold Soltz, Andrea M. Johnson, "Optimal Estimation of Dynamic Ionosphere Induced Group Delays of GPS Signals", pp. 485-495, ION 63rd Annual Meeting, Apr. 23-25, 2007, Cambridge, MS.

Euiho Kim, Tood Walter, J. David Powell, "Optimizing WAAS Accuracy/ Stability for a Single Frequency Receiver", pp. 962-970, ION GNSS 19th International Technical Meeting of the Satellite Division, Sep. 26-29, 2006, Forth Worth, TX.

Jong-Hoon Won, Dominik Dotterbock, Bernd Eissfeller, "Performance Comparison of Different Forms of Kalman Filter Approach for a Vector-Based GNSS Signal Tracking Loop", pp. 3037-3048, 22nd International Meeting of the Satellite Division of the Institute of Navigation, Sep. 22-25, 2009, Savannah, GA.

Onsy Abdel Alim, Ahmed El-Rabbany, Refaat Rashsd, Mohamed Mohasseb,"Pseudorange Correction Prediction Using Artificial Neural Network", pp. 396-399, ION NTM 2006, Jan. 18-20, 2006, Monterrey, CA.

Jian Wang, Jinling Wang, Craig Roberts, "Reducing Carrier Phase Errors with EMS-Wavelet for Precise GPS Positioning", pp. 919-928, ION NTM2007, Jan. 22-24, 2007, San Diego, CA.

Yanming Feng, Yi Zheng, Zhengdong Bai, "Representing GPS Orbits and Corrections Efficiently for Precise Wide Area Positioning", pp. 2316-2323, ION GNSS 17th International Technical Meeting of the Satellite Division, Sep. 21-24, 2004, Long Beach, CA.

Christopher Hegarty, M. Bakry El-Arini, Taehwan Kim, Swen Ericson, "Scintillation Modeling for GPSANAAS Receivers", pp. 799-807, Proceedings of the 1999 National Technical Meeting of the Institute of Navigation, Jan. 25-27, 1999, San Diego, CA.

Luiz Carlos Laureano Da Rosa, Diego Rolando Mendez Castillo, Fernando Walter, "Statistical Model to Minimize the GPS System Errors: A Tool to Support DGPS/GBAS", pp. 2640-2647, ION GPS 2002, Sep. 24-27, 2002, Portland, OR.

Jinling Wang, "Stochastic Assessment of the GPS Measurements for Precise Positioning", pp. 81-89, Proceedings of the 11th International Technical Meeting of the Satellite Division of the Institute of Navigations (ION GPS 1998) Sep. 15-18, 1998, Nashville, TN.

Dr. Lawrence R. Weill, "Theory and Applications of Signal Compression in GNSS Receivers", pp. 708-719, ION GNSS 20th International Technical Meeting of the Satellite Division, Sep. 25-28, 2007, Forth Worth, TX.

Gerald L. Mader, Michael L. Morrison, "Using Interpolation and Extrapolation Techniques to Yield High Data Rates and Ionosphere Delay Estimates from Continuously Operating GPS Networks", pp. 2342-2348, ION GPS 2002, Sep. 24-27, 2002, Portland, OR.

Radio Technical Commision for Maritime Services, "Radio Technical Commission for Maritime Services Standard Development Policies", Version 1.0 Oct. 5, 2005, 13 pages.

Radio Technical Commission for Maritime Services—Developed by RTCM Committee No. 104, "RTCM Standard 10410.1 Networked Transport of RTCM via Internet Protocol (Ntrip)—Version 2.0", 36 pages, Jun. 28, 2011.

Radio Technical Commission for Maritime Services—Developed by RTCM Special Committee No. 104, "RTCM Standard 10401.2 for Differential Naystar GPS Reference Stations and Integrity Monitors (RSIM)" pp. 1-114, Dec. 18, 2006.

National Aeronautics and Space Administration Gooddard Space Flight Center, "Gravity Recovery and Climate Experiment (GRACE)", 2 page paper printed Nov. 30, 2012.

Polynomial Regression Models paper in 3 pages, web printout Nov. 18, 2012.

Polynomial Functions paper in 6 pages, web printout Nov. 18, 2012.
PlanetMath.org paper in 3 pages, web printout Nov. 18, 2012.

* cited by examiner

Reference Station Block Diagram

Rover Device Block Diagram

METHOD AND APPARATUS FOR REDUCING SATELLITE POSITION MESSAGE PAYLOAD BY ADAPTIVE DATA COMPRESSION TECHNIQUES

STATEMENT REGARDING FEDERALLY SPONSORED RESEARCH

This invention was made with government support under contract number DTR57-12-C-10006 awarded by the Volpe Center of the Research and Innovative Technology Administration (RITA) of the United States Department of Transportation (DOT). The government has certain rights in the invention.

FIELD OF THE INVENTION

The present application relates generally to reduction of Differential Global Navigation Satellite Systems (GNSS) message payload by adaptive compression techniques.

BACKGROUND OF THE INVENTION

Global Navigation Satellite Systems (GNSS) have grown beyond GPS and GLONASS with the deployment of new designs including the Japanese QZSS, European Galileo, and Chinese COMPASS systems, all of which follow the same fundamental methods of operation and position determination based on RF radio wave ranging techniques. The use and availability of various corrections to aid in the accuracy obtained from a satellite in a GNSS have grown as well.

To improve the accuracy obtainable for positioning and navigation data using a GNSS receiver, various techniques are employed. Some of these involve algorithmic improvements internal to the devices, others involve aiding the device with externally provided information. At a broad level these latter items fall onto three areas: corrected or improved orbital information, clock drift information, and localized propagation effects from the ionosphere and troposphere.

To overcome the localized propagation effects specifically, many kinematic or stationary positioning applications make use of one or more additional GNSS receivers. In this method, a reference receiver placed at a well-known location, referred to as the reference station, receives the same satellite signals as a remote receiver referred to as the rover. The measurement information obtained by the reference station is then sent to the rover, and used, along with knowledge of the actual position of the reference station, to compute the measurement errors common to both the reference station and the rover. This process typically occurs in real time or near real time, but can also occur in post-processing, where the data may be stored and dealt with when convenient. And multiple rovers may connect to any given reference station via a variety of communications devices (both one way and two way).

By taking the difference between signals received both at the reference station and at the remote rover, common-mode errors are effectively eliminated. This facilitates an accurate determination of the rover's coordinates relative to the reference station's coordinates. When the reference station's coordinates are kinematic (such as the case of nearby operating rovers/vehicles exchanging data), this further facilitates an accurate determination of position of each vehicle relative to the other.

This general technique of differencing signals is known in the art as differential GPS (DGPS) or differential GNSS (DGNSS). When DGPS/DGNSS positioning using one or more carrier phases is done in real time while the rover is semi-static or in motion, it is most often referred to as Real-Time Kinematic (RTK) positioning.

A common feature of all these techniques involves sending either correction or raw measurement data from the reference station to a GNSS rover receiver in the field. A constant stream of this information is then used by the rover to perform pseudo-range adjustments, double differencing, and/or various other techniques known to those skilled in the art to refine the positioning and navigation data calculated by the rover receiver. Loss of, or interruption of, this data stream can in turn be very disruptive to the rover unit. This commonly occurs when various wireless transmissions systems are used. Such systems suffer from the same RF propagation issues as the GNSS signals and may be blocked or suffer from corrupting effects of multipath on the received signal.

The rate of sending such corrections varies with the rover population and the capacity of the delivery media. A variety of delivery media have been successfully used over the years, including dedicated radio links, commercial broadcasting, government operated broadcasting, cellular technologies, paging, Wifi, DSRC, and geostationary and LEO satellite links. A common update rate is at 1 Hz, although faster rates are used when there is need. Lower update rates of 5 to 15 seconds are also found, typically due to limits of the transmission technology. In the USCG NDGPS system, data rates of 50, 100, or 200 bits per second limit both the signal content and the message repetition rates (5 to 10 seconds between updates). In many commercial systems a combination of compression and adaptive scheduling is used to conserve bandwidth. With the advance of widespread TCP/IP connections over wireless and the growth in NTRIP sites, access to many reference stations can be obtained over the Internet at locations well beyond their effective service areas.

There may be a dozen or more GNSS satellites simultaneously in view above the horizon at a given location and time. The general requirement is to provide differential corrections for all signals of each tracked satellite (both code and carrier for L1, L2, L5, and beyond in newer GNS systems). In some applications this may be relaxed if the body of rover devices to be supported does not, or will not, track a given signal of interest. Because the reference station cannot generally know which satellites are in view of each individual rover at any instant in time, it is customary to send information covering the entire sky down to a relatively low elevation mask. As the number of active GNSS satellites deployed continues to grow with the continued deployment of new systems like the European Galileo and the Chinese COMPASS, the bandwidth required to exchange all data necessary for differential corrections will continue to increase as well. Data rates of 15 kbs or more are required today to convey this information for GPS and GLONASS satellites, and even this can be prohibitive and problematic for various reasons.

Accordingly, the present application recognizes a need to transmit the essential information to rover devices without the use of excessive bandwidth or being subject to immediate degrading when loss and corruption of one or more messages in a sequence occurs. The present application also recognizes a general need for dynamically adapting compression rules or approaches as the environment or information properties change to further optimize the information exchanged and the bandwidth thus required or used. Present principles also recognize that such benefits be provided in a completely lossless and reversible fashion when required, and in a modestly lossy fashion for those rovers for which the additional data are not of value or required. As understood herein, there is also a general need to accommodate variations in update rates and to allow the rover itself to select the exact point in time for which suitable data is needed.

SUMMARY OF THE INVENTION

Thus, the problem addressed herein is to generate and transmit the essential error correction information to the rover devices without using excessive bandwidth, but using as much bandwidth as is available to enhance accuracy, and to do so in a way that adapts to changing conditions instead of employing a one-size-fits-all compression technique.

In brief overview, instead of expressing DGNS data at a point in time in a standardized, fixed message format, present principles adaptively vary the message composition process used as a function of the range data themselves or as a function of specific circumstances under which the data is being transmitted. Thus, the present application discloses an adaptive method by which the range data or related parameters can be incorporated into messages such that the message size is significantly smaller than that of a similar message containing the same data elements in an uncompressed form. Present principles encompass an anchor/delta/nonce encoding scheme that is used for the transmission of data, the adaptive adjustment of encoding parameters such as data content, word sizes, channel allocations, frequency of updates, and achievable fidelity of decompressed data based upon numerical characteristics of the data to be transmitted and other criteria, and the handling of anomalous conditions such as out-of-range data values.

Accordingly, an apparatus such as for a reference station includes a processor and a computer readable storage medium accessible to the processor and bearing instructions which when executed by the processor cause the processor to undertake logic that includes receiving plural measurement data to be transmitted to a rover for satellite navigation purposes. At least some measurement data are established by at least a respective anchor value and a respective delta value. The logic also includes compressing at least some of the measurement data using a first compression, receiving at least one indication of changing measurement data and/or changing transmission medium characteristics, and based at least in part on the indication, dynamically changing from compressing at least some of the measurement data using the first compression to compressing at least some of the measurement data using a second compression.

In some embodiments the act of dynamically changing from the first compression to a second compression includes changing a number of bits assigned to some parts of a measurement datum. In other embodiments the act of dynamically changing from the first compression to a second compression includes changing an order of a model used to convey positional data based on measurement data. If desired, the act of dynamically changing from the first compression to a second compression can include changing a scaling constant in a model used to convey positional data based on measurement data.

In example embodiments at least one measurement datum is further established by a nonce part, and the act of dynamically changing from the first compression to a second compression may include changing at least one of: a number of bits assigned to the nonce part, an order of a model used to convey positional data based on the nonce part, or a scaling constant in the model.

In example implementations each of at least some of the measurement data defines a respective anchor portion and a respective delta portion, and delta portions are sent to a rover more frequently than anchor portions. Moreover, each of at least some of the measurement data may define a respective anchor portion, a respective delta portion, and a respective nonce portion, with delta portions being sent to a rover more frequently than anchor portions, and with nonce portions being sent to a rover more frequently than delta portions.

In non-limiting examples the first compression includes a respective anchor transmission rate and a delta transmission rate, the second compression includes a respective anchor transmission rate and a delta transmission rate, and at least the anchor transmission rate in the second compression is different from the anchor transmission rate in the first compression, and/or at least the delta transmission rate in the second compression is different from the delta transmission rate in the first compression.

In another aspect, an apparatus such as for a rover platform includes a processor and a computer readable storage medium accessible to the processor and bearing instructions which when executed by the processor cause the processor to undertake logic that includes receiving plural measurement data for satellite navigation purposes. At least some measurement data are established by at least a respective anchor value and a respective delta value. The method includes decoding at least some of the measurement data using a first decompression, receiving an indication of a second compression being used, and based on the indication, dynamically changing from decoding the measurement data using the first decompression to decoding the measurement data using a second decompression.

In another aspect, an adaptive method by which differential global navigation satellite system (GNSS) corrections are compressed includes establishing for each measurement datum to be transmitted to a rover for satellite navigation purposes at least an anchor value and a delta value. At least one encoding parameter of the measurement data is adaptively adjusted based on changing data and/or transmission medium characteristics.

In another aspect, a device includes at least one transmit part configured for obtaining and/or determining data elements from one or more sources, with the data elements representing measurements or other information associated with one or more entities, and by means of data compression and encoding, representing an ensemble of the data elements as a set of messages that are transmitted via one or more suitable transmission media. At least one receive part is configured for receiving, decoding, and decompressing messages created by transmitting part so as to reconstitute data elements contained within the messages, such that a composite size of the messages is significantly smaller than a composite size of a set of messages representing same the data elements in an uncompressed form. The transmit part is configured for controlling an achievable fidelity of reconstitution of the data elements, by the receive part, by means of an alteration of one or more parameters in the data compression and encoding. Also, the transmit part is configured for adaptively changing compression and/or encoding parameters in response to changing requirements, situations, and/or data, the transmit and receive parts being configured for graceful accommodation of and/or recovery from one or more anomalous data elements that cannot be represented by the encoding, by means of signals encoded in the messages.

In this latter aspect, the data elements include range, range-rate, range corrections, and/or quantities related to range, and corresponding times, and/or parameters used in the determination thereof, associated with observations of one or more GNSS satellites by one or more GNSS reference stations at fixed locations on the surface of the Earth. Or, the data elements include parametric models or other representations that are functions of time, and from which range, range-rate, range corrections, and/or quantities related to range, and corresponding times, and/or parameters used in the determination thereof, may be derived by evaluation of the parametric models or other representations. The messages represent information that is transmitted by one or more GNSS reference stations to one or more mobile or stationary GNSS rovers via one or more transmission media, as a part of an implementation of GNSS differential range correction.

Still referring to this last described aspect for the remainder of the summary, compression and encoding parameters are known to both transmit part and receive parts because compression and encoding parameters are predetermined and either fixed, or changed according to a schedule, or compression and encoding parameter values are changed by the transmit part from time to time, then transmitted to receive parts when changed, or more frequently, or compression and encoding parameter values are changed by external entities from time to time, then conveyed to transmit part and receive parts when changed, or more frequently.

Compression and encoding parameters associated with each GNSS satellite signal may be unique to each signal. Some or all of a set of compression and/or encoding parameters can be shared among more than one GNSS satellite signals. The transmit part may transmit one or more sets of compression and/or encoding parameters to receive part by means of an index to a mutually shared table or list of such parameters. The transmit part can transmit one or more sets of compression and/or encoding parameters to receive part by means or one or more auxiliary communications methods. Compression and/or encoding parameter values may be transmitted more frequently than a rate at which the values actually change, and an amount of time that passes between when a receive part becomes able to receive data messages from a transmit part, and when the receive part possesses sufficient information to decode and decompress the data messages, is thereby reduced.

The data elements may be decomposed into a set of long-term values that change slowly or not at all, and are optionally represented at a reduced numerical precision and/or accuracy, values or representations of which are transmitted infrequently, and/or a set of short-term values that change quickly, and are optionally represented at a reduced numerical precision and/or accuracy. Values or representations of this second part can be transmitted frequently. The data may also be decomposed into an optional set of residuals, values or representations of which are transmitted as necessary, that provide instantaneous corrections to data elements reconstituted only from the long-term and short-term values such that reconstituted data elements can match original data elements to within an increased numerical precision and/or accuracy.

The set of long-term values may represent full quantities of corresponding original data elements, to within a desired numerical precision and/or accuracy. The set of short-term values may represent differences between a set of current data elements and a corresponding set of recent previous data elements, to within a desired numerical precision and/or accuracy. The set of short-term values can represent differences between a set of current data elements and a most recently transmitted set of long-term values. Reconstitution of the set of current data elements may depend only upon the set of short-term values and the most recently transmitted set of long-term values. Reconstitution of the set of current data elements is thus possible even in cases where one or more recently transmitted sets short-term values has not been received. The set of short-term values can represent differences between a set of current data elements and a sum of a most recently transmitted set of long-term values and at least one set of recently transmitted short-term values. Compression is achieved because the differences have smaller magnitudes than corresponding fun quantities of the current data elements, and thus encoding of differences results in a smaller message payload than does encoding of full quantities of data elements.

The set of residuals may represent differences between a set of current data elements and a most recently transmitted set of long-term values, or a sum of a most recently transmitted set of long-term values and at least one recently transmitted set of short-term values.

Multiple individual long-term, short-term, or residual values may be decomposed into a sum of a value common to all the individual values and an excess value unique to each individual value. The common value and the multiple unique excess values can be encoded into one or more messages by transmit part in lieu of the multiple individual values, along with sufficient ancillary information to enable receive part to reconstitute data elements therefrom. Data compression is achieved because fewer message bits are required to represent the single common value and multiple unique excess values than are required to represent the multiple individual values.

Long-term values may be transmitted at a rate based upon a rate at which the data elements change, a fidelity with which the reconstituted data elements must match the original data elements, some constraints upon transmission bandwidth and/or data payload, and/or an ability of receive parts to tolerate data starvation. Short-term values may be transmitted at a rate based upon a rate at which the data elements change, a fidelity with which the reconstituted data elements must match the original data elements, some constraints upon transmission bandwidth and/or data payload, and/or an ability of receive parts to tolerate data starvation. Also, optional residual values can be transmitted at a rate based upon a fidelity with which the reconstituted data elements must match the original data elements, and/or some constraints upon transmission bandwidth and/or data payload.

Data elements may include parametric models or other representations that are functions of time, and parameters of the parametric models or other representations can be transmitted instead of values that parametric models or other representations represent. The parametric models or other representations may be evaluated by receive parts with respect to a current or past time, to reconstitute associated values that parametric models or other representations represent, to within a desired numerical precision and/or accuracy. The parametric models or other representations may be evaluated by receive parts with respect to a future time, to estimate future values that parametric models or other representations represent. Compression is achieved because encoding of the parameters results in smaller message payload than does encoding of values from which models or other representations are derived. The parametric models or other representations may be used to estimate future values, allowing receive parts to tolerate periods of data starvation in an event of inability to receive one or more signals from transmit part or purposeful reduction in transmission rates of long-term values, short-term values, and/or residuals.

Each the parametric model or other representation can incorporate an independent set of scale factors for each of long-term values, short-term values, and residuals. The device can adapt to exploit trending information regarding data elements when available, or to remain operable when the trending information is absent.

One or more long-term values may be expected to remain constant for some periods of time spanning two or more long-term transmission epochs. The transmit part can transmit, in addition to each the constant long-term value, one or more indications of a number of long-term transmission epochs over which associated long-term value is expected to remain constant. Also, the transmit part can transmit each of the constant long-term values in an associated initial message, and omits each of the constant long-term values in at least one subsequent message.

The transmit part can adaptively change compression and/or encoding parameters for one or more sets of data elements. A quality metric may be considered when determining compression and/or encoding parameters. The metric may include a fidelity with which data elements reconstituted from transmitted messages can match original data elements, an ability of parametric models or other representations of data elements to predict future values, a time that passes between when a receive part becomes able to receive data messages from a transmit part, and when the receive part possesses sufficient information to decode and decompress the data messages. The adaptive changes can be applied such that the quality metric for data elements reconstituted by receive parts is maximized within a constraint upon allowable maximum average or instantaneous size of the messages. The quality metric and/or the constraint may change over time. The adaptive changes may also be applied to minimize an average or instantaneous size of messages to be transmitted by transmit part while satisfying the quality metric for data elements reconstituted by receive parts; where the quality metric may change over time.

Compressed message payload contents can be selected so as to achieve a balance between message content, message payload size, and message transmission rates, in response to evolving trends in the data elements themselves. A data value that falls outside a range that can be represented within an associated current allocation of message payload in a current long-term, short-term, or residual message, or is otherwise anomalous, can be accommodated by an indication, within the message, that the data value is out of range, and if a sufficient message capacity remains, utilization of a sufficient portion of the remaining message capacity to temporarily extend range of the value such that it can be represented. Or, the out of range value can be accommodated by an indication, within the message, that the data value is anomalous and thus cannot be represented, is corrupt, or is missing. If desired, one or more data elements can be encrypted prior to encoding into messages. One or more messages can be encrypted prior to transmission, or may be transmitted via encrypted channels or media.

The details of the present invention, both as to its structure and operation, can best be understood in reference to the accompanying drawings, in which like reference numerals refer to like parts, and in which:

DETAILED DESCRIPTION OF THE PREFERRED EMBODIMENT

Figure 1:
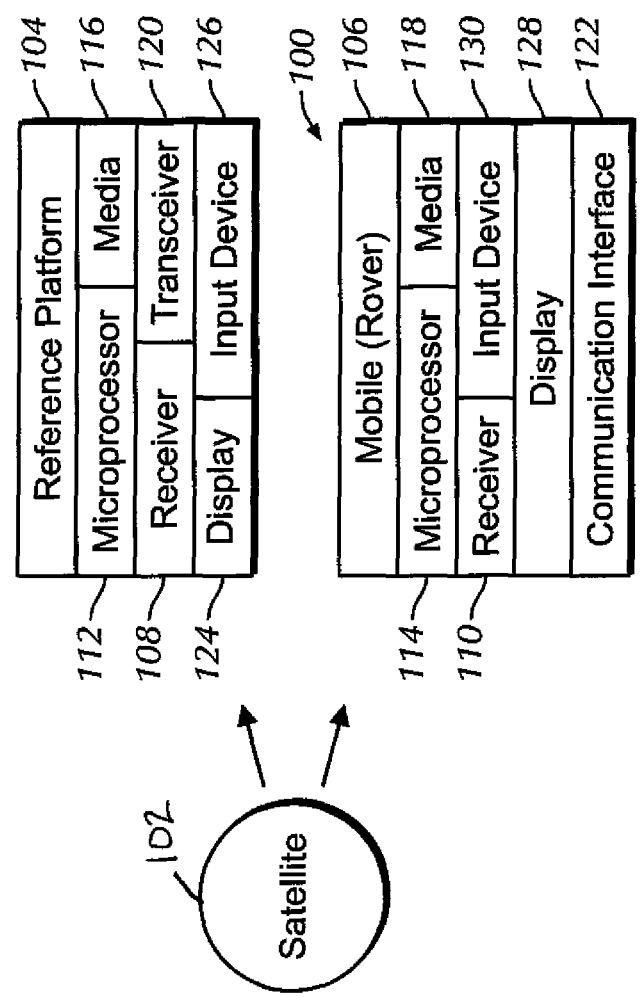
FIG. 1 is a block diagram of an example system according to present principles.

Referring initially to FIG. 1, an example system 100 that can be used to implement principles above includes one or more navigation satellites 102 located in space above the Earth and one or more reference stations 104 that typically are immovably disposed at known, unchanging locations on the Earth. One or more mobile platforms, hereinafter rovers 106, are also included in the system 100. Both the reference station 104 and rover 106 receive position signals from the satellite 102 through respective satellite receivers 108, 110 sending signals to respective processors 112, 114 accessing instructions contained on one more respective computer readable storage media 116, 118 such as disk-based or solid state storage to execute logic according to present principles. Note that for purposes of this disclosure, a 'satellite' in the term global navigation satellite systems (GNSS) encompasses any fundamental source of raw coordinated or uncoordinated position and ranging data such as that transmitted by a GNS system or an earthbound source. This includes purposefully deployed devices such as a "pseudo-satellite" placed at and near airports and other uses of the pseudo-satellite concept, as well as any other terrestrial point of RF emission (often called "signals of opportunity") that are used for ranging, alone or in conjunction with, other GNSS signals regardless of their original design intent, such as and including: commercial broadcasting, cellular, global system for mobile communication (GSM), long term evolution (LTE), and various WiFi emissions.

As set forth above and explained further below, the reference station 104 extracts distance measurements from the signal it receives from the satellite 102 and sends, via a suitable transmitter 120, indications of those measurements to a communication interface 122 of the rover 106 so that the rover processor 114 can quantify errors in the measurements of distance between satellite 102 and reference station 104, and apply corrections for those errors its own position as determined from the signal from the satellite 102. In some embodiments the reference station 104 may be embodied as a computer that includes a display 124 controlled by the processor 112 and an input device assembly 126 such as keyboards, mice, etc. for sending user input to the processor 112. Likewise, the rover 106 may be embodied as a computer in, e.g., a mobile platform such as a telephone, a vehicle, etc. that includes a display 128 controlled by the processor 114 and an input device assembly 130 such as keyboards, mice, etc. for sending user input to the processor 114.

Figure 4:
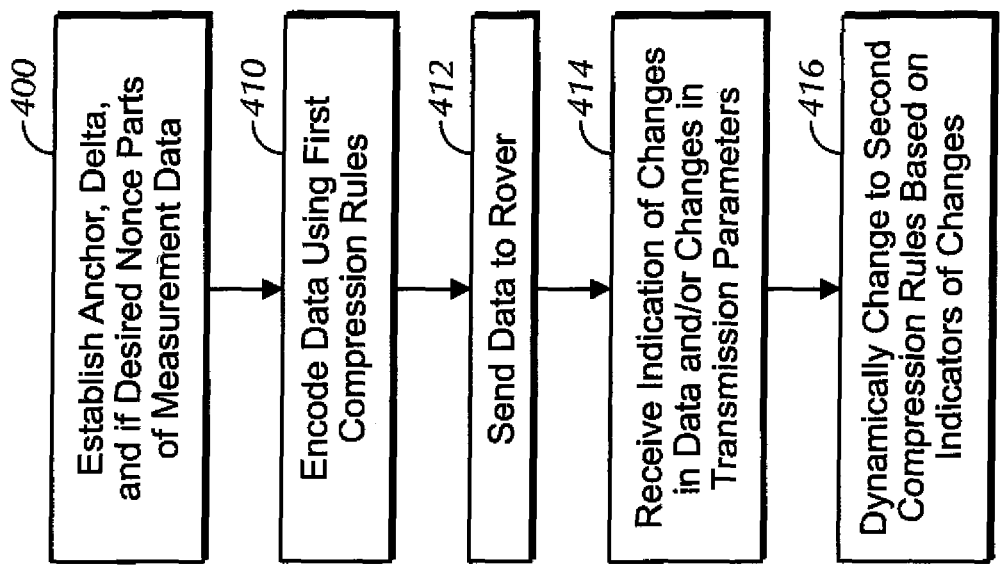
FIG. 4 is a flow chart of example overall logic according to present principles herein.

In some embodiments, the reference station 104 may execute the logic illustrated in FIG. 4 to send navigation measurement data to the rover 106. In example embodiments, the reference station 104 may be a global navigation satellite (GNS) reference station that has access to various differential correction signals in either a well-known or standardized format such as one of the many Radio Technical Commission for Maritime Services, Special Committee 104 (RTCM SC-104) message forms, a receiver independent exchange (RINEX) data stream, or in another format consisting of sequences of data values packaged into various formats and messages. These differential correction signals are decoded by the reference station 104 into their constituent elements, examined with regard to various aspects of trending, short term numerical ranges, and measurement noise properties, and compressed according to the aspects set forth herein. The data may be further encoded into an appropriate message format for transport over a communications protocol and medium such as user datagram protocol (UDP), transmission control protocol/Internet protocol (TCP/IP), or others. A receiver device such as the rover 106 recovers this stream of compressed messages and reverses the process to produce either the original data values or a reformatted message more suited to its own needs.

A reference station 104 or other device built in accordance with principles disclosed herein can use several compression aspects in harmony to produce the compressed message that is to be exchanged. This is achieved, in part, by examining the characteristics of the individual elements that make up the source data. All of these aspects exploit the fact that the data element in question will not likely occupy every valid numerical value that is defined for it in the message format over a limited period of time.

Figure 1A:
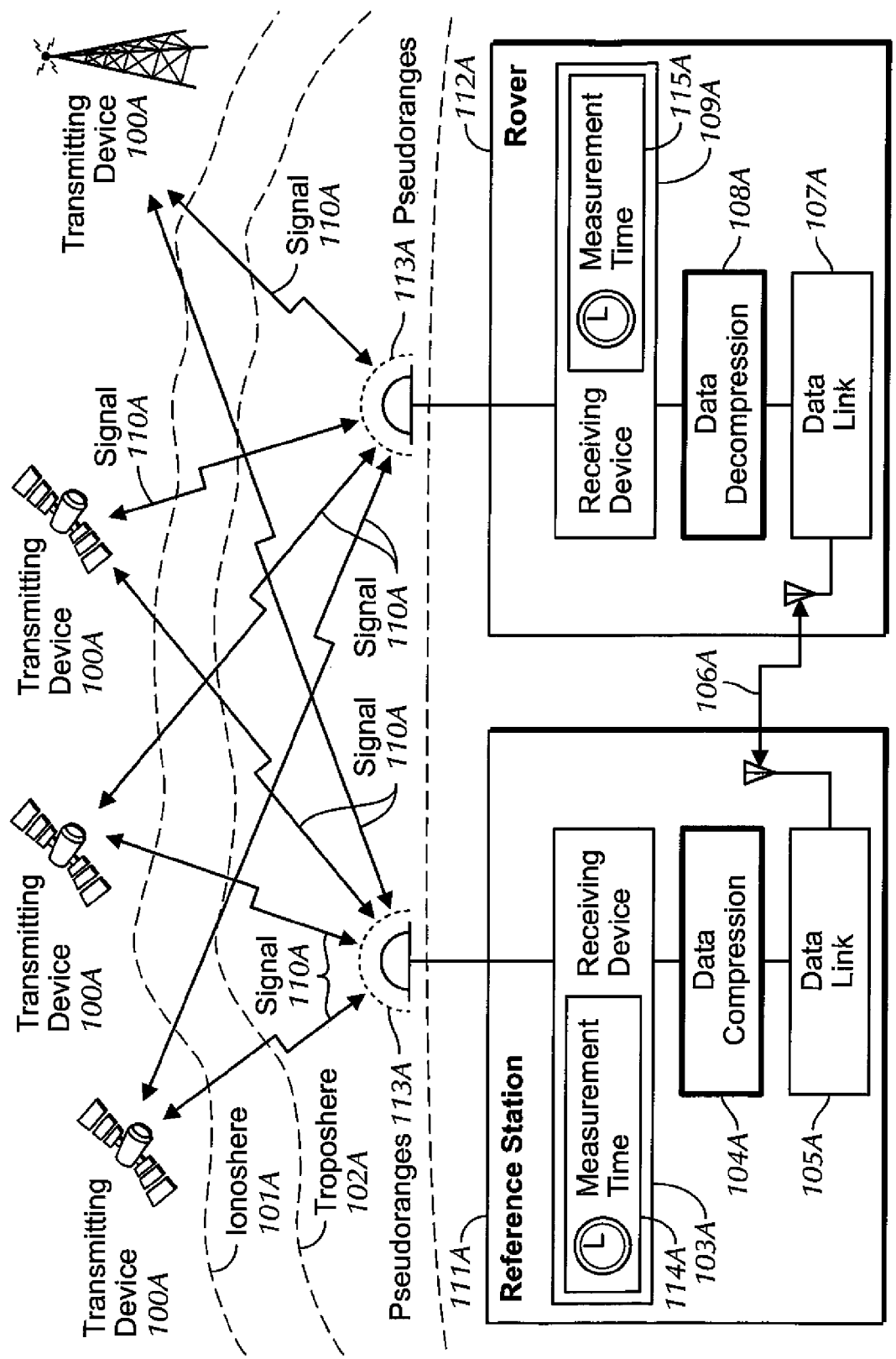
FIG. 1A is a block diagram of an example system similar to FIG. 1, illustrating additional aspects.

FIG. 1A illustrates additional principles touched on above. A position Signal 110A is broadcast by a Transmitting Device 100A and received by Receiving Devices 103A (reference station) and 109A (rover) after passing through the ionosphere 101A and troposphere layers 102A. Transmitting Device 100A and Receiving Devices 103A and 109A can all move during the time required for Signal 110A to propagate between them, and this movement must be mathematically compensated based upon knowledge of the motions of Transmitting Device 100A, Receiving Devices 103A and 109A, and the propagation velocity of Signal 110A. Such a measurement of instantaneous distance between Transmitting Device 100A and Receiving Device 103A or 109A, mathematically compensated for motions as described above, is known as a "pseudorange".

In the preferred embodiment, Signal 110A is a GNSS modulated radio frequency (RF) signal, as broadcast from GPS, GLONASS, GALILEO, QZSS, Beidou/Compass satellites, or the like; Transmitting Device 100A is a GNSS satellite; Receiving Device 103A is a GNSS receiver in a GNSS reference station, at a fixed and precisely-measured location on the surface of the earth; and Receiving Device 109A is a GNSS receiver in a rover, at an arbitrary location, stationary or mobile. However, Signal 110A may be any signal with predictable or measurable propagation characteristics, including but not limited to electromagnetic (EM) signals such as radio, television, RADAR, LIDAR, and acoustic signals such as SONAR; Transmitting Device 100A can be any device capable of transmitting Signal 110A, and might be mobile as in the preferred embodiment, or fixed; Receiving Devices 103A and 109A can be any devices capable of receiving Signal 110A, and might be fixed as in the case of reference station Receiving Device 103A, or mobile as in the case of rover Receiving Device 109A. Furthermore, both of the Devices 103A and 109A can serve dual functions as transmitters and receivers, resulting in two independent Signals 110A that are mutually exchanged, as in, for example, the satellites used in the Gravity Recovery And Climate Experiment (GRACE) project, or in vehicles such as automobiles, trucks, motorcycles, ships, or aircraft, as part of a vehicle-to-vehicle (V2V) collision-avoidance system or similar application.

Pseudoranges 113A are computed in Receiving Devices 103A and 109A, or in ancillary computational equipment such as a general purpose computer or other suitable device, using the Signals 110A and the associated times-of-transmit and times-of-receipt, and other information such as knowledge of the rate of rotation of Earth, by means known in the art. Each Pseudorange 110A is almost always corrupted by various errors. In the GNSS preferred embodiment, for example, each calculated value of Pseudorange 113A may be corrupted by measurement errors due to imprecise knowledge of time (on both the transmit and receive ends), perturbations in the speed-of-light through the ionosphere 101A, troposphere 102A, or other layers of the atmosphere, multipath, and others.

As shown in FIG. 1A, a plurality of such Pseudorange 113A values and the associated times at which they occurred, designated Measurement Times 114A and derived by appropriate means from time-of-receipt and time-of-transmit, are recorded by Receiving Device 103A. Depending upon specific needs and capabilities, Pseudorange 110A values may be collected from one or more than one Transmitting Device 100A at any given time; estimates of range-rate may be computed from Pseudoranges 110A and associated Measurement Times 114A; or range corrections may be computed, based upon differences between the apparent position of Receiving Device 103A as derived from the pseudorange measurements (which are corrupted by measurement errors) and the known actual position of Receiving Device 103A. All such computations are by means well known in the art. The resulting data, whether pseudorange, range-rate, or range corrections, or other quantities related to range (including parameters used in the determination of quantities related to range, as described above), and the times associated with them, are hereafter designated "Range Data".

Some or all of the aforementioned Range Data may be obtained by Receiving Device 103A via messages received from other entities, such as, in the case of the GNSS preferred embodiment: RTCM SC-104 (Radio Technical Commission for Maritime Services, Special Committee 104) or RINEX (the Receiver Independent Exchange format) messages, or from various public or private formats devised by device manufactures, or similar. For the purposes of the present invention, treatment of Range Data obtained from these alternate sources is identical to that of Range Data directly obtained by Receiving Device 103A.

In some cases, Receiving Device 103A may implement alternate representations of the Range Data such as parametric models, or similar, in which cases the parameters associated with or resulting from the alternate representations replace the actual Range Data as the data entities to be accommodated.

Having observed, computed, and/or received Range Data or parameters as described above, Receiving Device 103A composes messages comprised of the Range Data or parameters, and transmits the messages to one or more Receiving Devices 109A via transmission channels such as, in the case of the GNSS preferred embodiment: the Internet, WiFi and IEEE 802.11 et al, LTE/3G/4G, DRSC, wireless modulations, or other means. Within Receiving Devices 109A the messages are reconstituted into their associated Range Data (including, if appropriate, transformation of the parameters back into the Range Data from which they were derived).

Having obtained the Range Data described above, a Receiving Device 109A has, or can compute, the errors (and thus the corrections) in the pseudoranges observed by Receiving Device 103A. If Receiving Device 109A is located in relatively close proximity to Receiving Device 103A, then the propagation path between Transmitting Device 100A and Receiving Device 109A is nearly identical to the propagation path between Transmitting Device 100A and Receiving Device 103A. Because the paths are so nearly identical, any corruption in Signal 110A as it propagates to Receiving Device 109A is also nearly identical to the corruption in Signal 110A as it propagates to Receiving Device 103A. Thus, the corrections that Receiving Device 109A now possesses for Range Data associated with Receiving Device 103A can be applied with nearly equivalent effect to Receiving Device 109A's own observations. This is the basis for differential corrections in the GNSS preferred embodiment.

Figure 2:
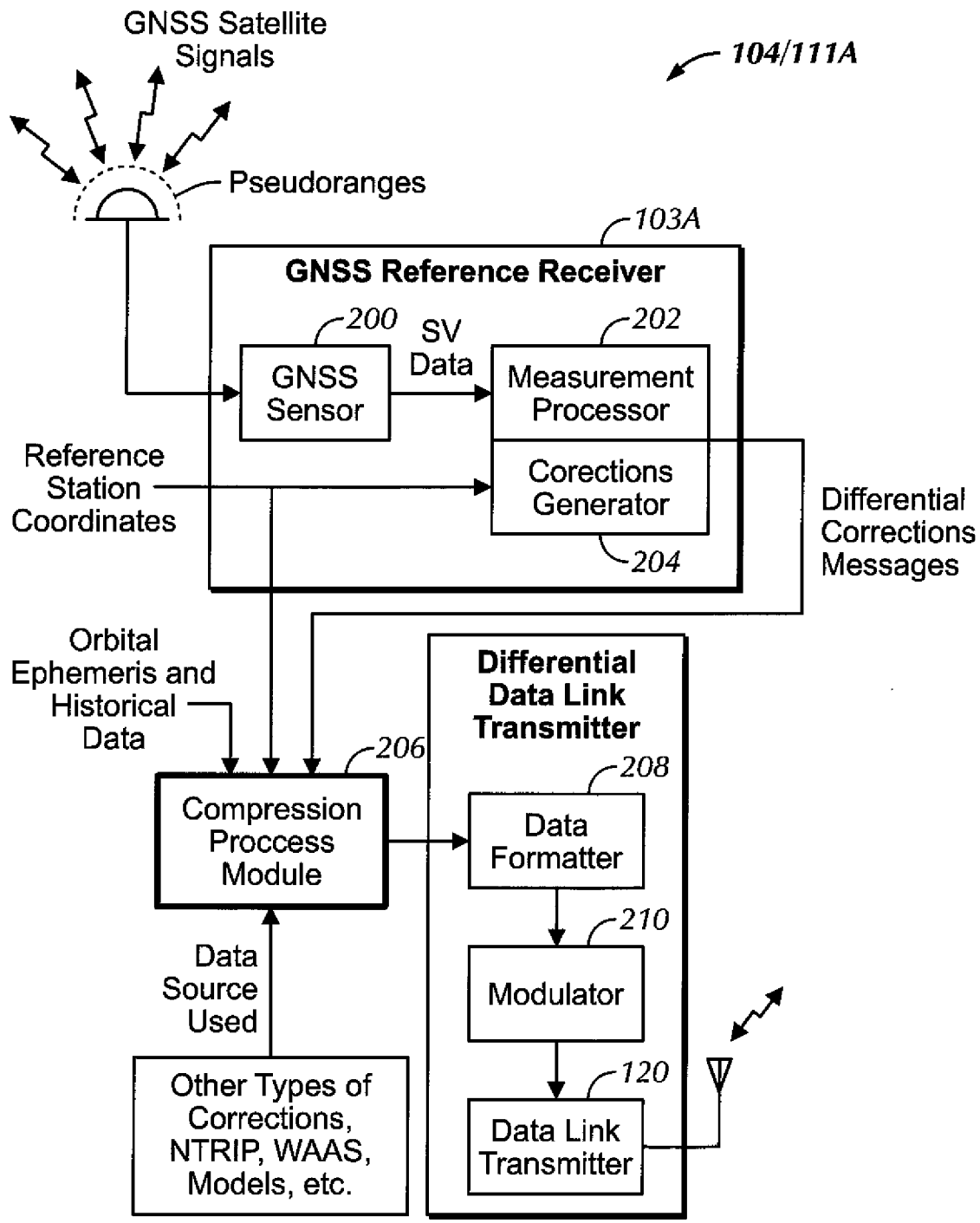
FIG. 2 is a block diagram showing features of an example GNSS reference station (such as the ones shown in FIGS. 1 and 1A) for a differential correction system that sends a stream of correction data between the reference station and rover, and which can be used to compress the data exchanged.
Figure 3:
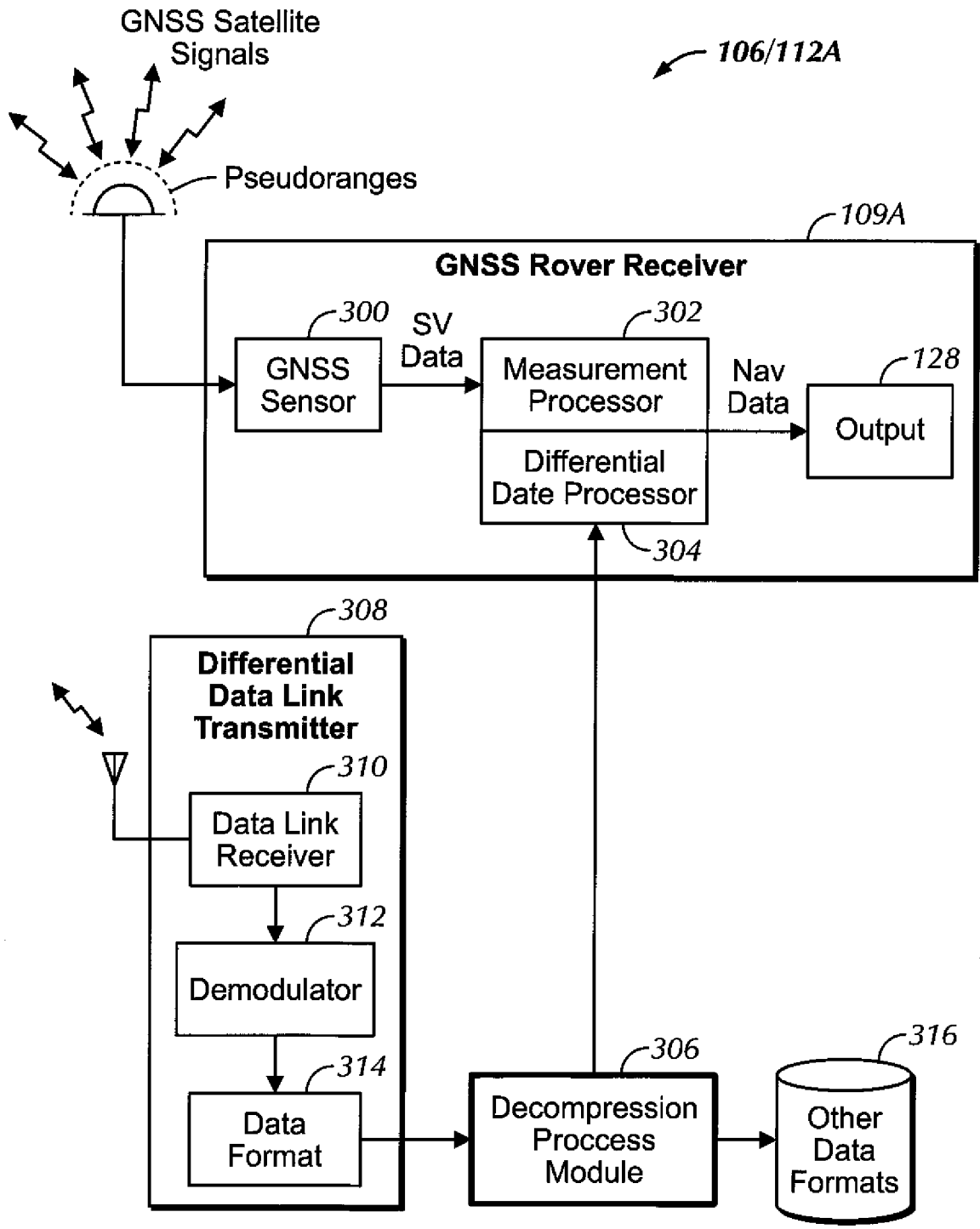
FIG. 3 is a block diagram showing features of a GNSS rover device (such as the ones shown in FIGS. 1 and 1A) for a differential correction system that receives a stream of correction data from a reference station, and which can be used to decompress the data exchanged.

FIGS. 2 and 3 respectively show additional features of a reference station (104 in FIG. 1, 111A in FIG. 1A), which uses the reference receiver 108/103A, and a rover station (106 in FIG. 1, 112A in FIG. 1A), which uses the rover receiver 110/109A. As shown in FIG. 2, pseudoranges and satellite signals are received at a satellite signal sensor 200 in the reference station receiver 103. Data is sent to a measurement processor 202, which may be implemented by the reference platform processor 112 in FIG. 1. The processor 202 executes a corrections generator module 204 that receives as input the geographic coordinates of the reference station 111. The output of the corrections generator module 204 are differential corrections messages, which are compressed according to principles below in a compression module 206 receiving as input various data including models, corrections data, orbital ephemeris data and historical satellite orbital data, wide area augmentation system (WAAS) data, network transport of Radio Technical Commission for Maritime Services data over IP (NTRIP), etc. The compressed data is sent to a data formatter module 208 for formatting the data into a message, and then to a modulator 210 for modulating and upconverting the data for transmission via the transmitter/transceiver 120, also shown in FIG. 1.

Turning to the rover device (designated 106 in FIGS. 1 and 112A in FIG. 1A) shown in greater detail in FIG. 3, pseudoranges and satellite signals are received at a satellite signal sensor 300 and sent to a measurement processor 302, which may be implemented by the rover processor 114 in FIG. 1. The processor 302 executes or accesses a differential data processor 304 to receive and apply differential corrections to the signals from the sensor 300 and to output a position of the rover 106/112A on, e.g., the display 128, also shown in FIG. 1. Note that the differential data processor 304 may be implemented by software or hardware.

As shown in FIG. 3, the differential data processor 304 receives differential data from a decompression module 306, which decompresses messages according to description below that are received from the reference platform shown in FIG. 2 through a differential data link receiver 308, which may be implemented by the communications interface 122 shown in FIG. 1. In the example shown, the differential data link receiver 308 includes a transceiver 310 receiving correction messages from the reference platform of FIG. 2, a modulator 312 downconverting and demodulating the correction messages, and a data formatter 314 formatting the demodulated information as appropriate for input into the decompression module 306. If desired, the decompression module 306, in addition to supplying correction information to the differential data processor 304, can store the correction information in one or more formats in a data storage 316, which may be implemented by the computer readable storage medium 118 shown in FIG. 1.

FIG. 4 illustrates principles discussed herein in flow chart format to give a non-limiting example of computer program instructions that may be stored on a computer readable storage medium for execution by a processor, in this case, the processor 112 of the reference station 104. Commencing at block 400, for at least some and preferably all measurement data, each datum is used to define a respective anchor part, a respective delta part, and in some cases a respective nonce part.

Figure 5:
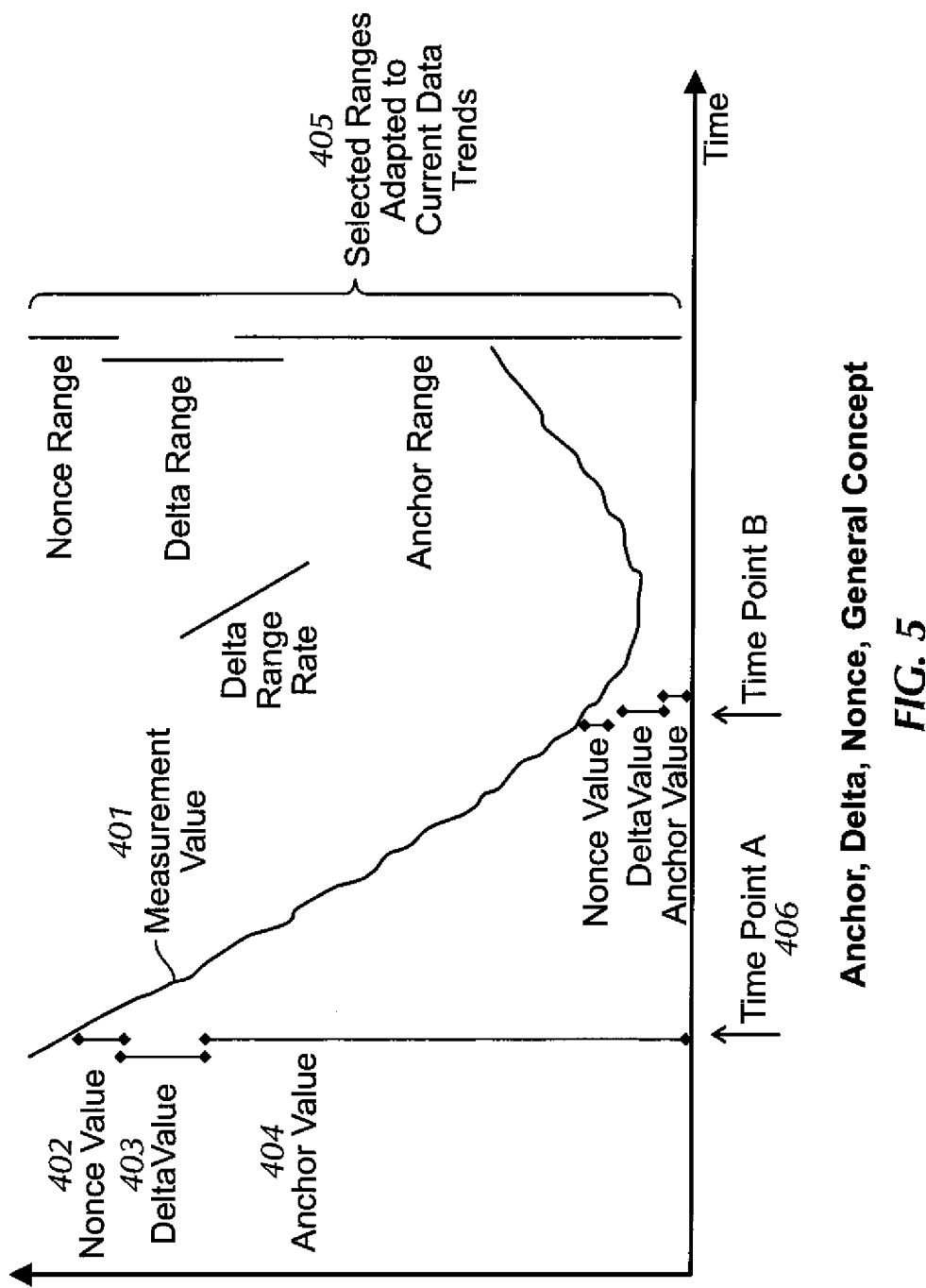
FIG. 5 is a schematic diagram illustrating the anchor/delta/nonce concept.

To illustrate this, reference is made to FIG. 5, showing an exemplary sequence of Measurement Values 401. Over various limited periods of time measurement values are constrained and will trend, and these trends can be exploited to remove the "stationary" portion of the data element and then send only the "residual" that remains for a given measurement point. Such trending need not be monotonic and wide allowances for inherent measurement noise can be made. In this exemplary case the Measurement Value 401 at Time Point A 406 is expressed as the sum of three component elements, namely, a Nonce Value 402, a Delta Value 403, and an Anchor Value 404, with the range and bit allocation for each having been selected from a set of predefined values as appropriate for the current situation, represented by Selected Ranges Adapted to Current Data Trends 405.

At various periods of time, the stationary values (and the encoding scheme chosen based on the signal's current or predicted properties) is reevaluated and information about any revised encoding scheme to be used must be sent. Considered broadly, this is an adaptive difference encoding scheme. This method implies that, until the data about the current operating point are recovered, the compressed data stream cannot be decoded, although means are disclosed to overcome this limitation.

Thus, as shown in FIG. 5 an individual data element or measurement within a message is broken down into two or more component parts which, when recombined according to a specified algorithm, can reconstruct the original value. The first of these is referred to as the "Anchor" herein and is placed into an infrequently issued message type called a "Key Frame" which contains other adaptive encoding information. The second is called the "Delta", and is sent more frequently, typically at the rate of the original source data. At other times and modes of operation, another message referred to as the "Nonce" is used to provide additional corrections for one time use. Any sequence of well-behaved data treated in this way can be compressed. The smaller the variation seen between short sequences of the source data and the longer the end user can wait for a Key Frame, the more compression that can be achieved (as the bits required to represent the set of Delta values are sharply reduced). In data that are ill-behaved (in this case sequential points of data that are quickly ranging over the entire allowed dynamic range) the bit width required for the deltas simply increases to represent the original source data and, while the same format can be used, less compression is achievable. Several variations on the above are also developed further below when the trending of the data follows broad or predictive trends such as those found over a satellite orbital period.

Still referring to FIG. 5, the trend of the subject measurement can be expressed in the anchor-rate and delta-rate values which use specific word widths and bit allocations, model orders, scaling, etc. (Selected Ranges Adapted to Current Data Trends 405), and which can be periodically updated as conditions change. Other variations can also be devised where the least significant bits of selected data can be removed to achieve further data compression (creating a smaller but lossy messages), or nonces used to create lossless transmissions. Still further variations on the above are developed where the trending of the data can be represented by first and second order models (or higher) over the selected period of time with residual differences represented in the delta portions.

The anchor/delta/nonce concept can be applied for almost every data element to be transmitted including pseudoranges, range rates, range corrections, etc. The use of a nonce is employed to create lossless operation when desired, and to support the general concept of tuning the delivered precision to the accuracy needs of a given class of users. This is employed herein when lossless operation is desired, when a model of the pseudorange measurement needs to be corrected to the original data point, and when additional data value precision beyond the level of standardized message encoding provided is desired.

An adaptive and dynamic assignment of the encoding scheme used is based on a combination of directly observed measurement trends and noise, combined with predicted and expected measurement noise and/or other expectations about the signal. Present principles are further capable of handling unexpected excessive measurement points (a data point that exceeds the currently chosen data range) gracefully. This encoding selection can be done individually for each signal of interest.

It is to be understood that the measurement values, also referred to herein as data elements, may consist of range, rate-of-change of range ("range-rate"), and/or range corrections, and corresponding times, associated with observations of one or more Global Navigation Satellite System ("GNSS") satellites by one or more GNSS reference stations at fixed locations on the surface of the Earth, and/or they may consist of parameters used in the determination of range, range-rate, or range corrections, and times, including but not limited to:
  receiver antenna locations,
  transmitter antenna phase offsets,
  orbital almanacs for one or more GNSS satellites,
  orbital ephemerides for one or more GNSS satellites,
  atmospheric parameters, such as total electron count,
  meteorological data, such as water vapor content or barometric pressure.

In some cases, the data elements may consist of representations of the entities described above, such as model parameters, instead of the entities themselves. In some cases, any or all of the data elements may be encrypted prior to encoding into messages, or the messages may be encrypted prior to transmission or transmitted via encrypted channels. And the messages represent information to be broadcast by the reference station(s) to unspecified users in the field ("rovers") as part of the implementation of GNSS differential range correction ("Differential GNSS" or "DGNSS"). It is from the standpoint of DGNSS that the invention is described in detail in the following.

Referring back to FIG. 4 for exposition of the process in general, followed by a more detailed explanation, at block 410 the anchor/delta/nonce data is encoded using first compression rules and transmitted at block 412 to the rover. In the event that indications are received by the reference platform of changes in the data (e.g., deviations from expected trends) and/or of changes in transmission parameters at block 414, the logic moves to block 416 to dynamically change compression of the anchor/delta/nonce data to second compression rules in response to the indications received at block 414.

With this overall logic in mind, further details are divulged below.

Both the reference platform and the rover are aware of the basic parameters of the coding process (fundamentals such as modulation type, synchronization words, location and interpretation of header information, the meaning assigned the individual bits in a message payload structure, encryption, etc.), and this mutual knowledge is assumed in the following.

In addition to the aforementioned fundamentals and as discussed above, a data transmission scheme is employed herein in which "long-term" data (information that changes slowly or not at all) are transmitted infrequently, while "short-term" data (information that changes quickly) are transmitted frequently, resulting in an overall reduction in data payload. This is the basis for an "Anchor/Delta" compression scheme, in which "Anchors" are long-term data transmitted infrequently and "Deltas" are short-term data transmitted frequently.

With this in mind, in some embodiments anchor values of range data or parameters are transmitted from the Reference Station relatively infrequently, at a rate determined on an individual signal-by-signal and case-by-case basis, which is based upon the rate at which the values or parameters change, the fidelity with which the reconstituted data must match the original data, constraints upon transmission bandwidth and/or data payload, and the ability of rovers to tolerate data starvation. Further, delta values of range data or parameters are transmitted from Reference Station relatively more frequently than anchor data, at times in-between times at which anchor values are transmitted, again at a rate determined case-by-case, based upon the same considerations.

The anchors can be used to represent "complete" values; for example, an anchor range might represent an actual pseudorange at the time associated with that anchor. On the other hand, the deltas represent value "differences"; for example, a delta range might represent the difference between the pseudorange at the time associated with that delta, and the pseudorange at the time associated with the most recent anchor (the anchor range). Compression is achieved because, in data that change reasonably slowly, delta values tend to have much smaller magnitude than anchor values, and thus deltas can be represented with fewer message bits than can anchors.

Mathematically, the relationship between anchors and deltas is as follows:

Case 1; A Delta represents the difference between the current datum and the most recent Anchor datum:

$$\text{datum}(K+k)=\text{Anchor}(K)+\text{Delta}(K+k)$$

so $$\text{Delta}(K+k)=\text{datum}(K+k)-\text{Anchor}(K)$$

where
  K is the Anchor index at the Anchor update rate,
  k is the Delta index at the Delta update rate,
  Delta update rate≥Anchor update rate.

Case 2; A Delta represents the difference between the current datum and the most recent previous datum (reconstructed from the previous Anchor and Deltas):

$$\text{datum}(K+k)=\text{Anchor}(K)+\text{Delta}(K+1)+\ldots+\text{Delta}(K+(k-1))+\text{Delta}(K+k)$$

so $$\text{Delta}(K+k)=\text{datum}(K+k)-[\text{Anchor}(K)+\text{Delta}(K+1)+\ldots+\text{Delta}(K+(k-1))]$$

Or a Delta may represent some compromise between the two Cases shown above.

As mentioned above, one of the considerations upon which the Anchor and Delta transmission rates is based, and thus one of the areas in which compromises can be made, is the fidelity with which the reconstituted data must match the original data. To provide more room for compromise in this particular area, while still accommodating higher data fidelity when needed, residual "correction" values, hereafter designated "Nonces", may be optionally transmitted. The mathematical relationship between Anchors, Deltas, and Nonces is as follows:

Case 1; A Delta represents the difference between the current datum and the most recent Anchor datum. (Delta values may be compromised by purposely reduced word length, or for other reasons):

datum($K+k+\kappa$)=[Anchor($K$)+Delta($K+k$)]+Nonce($K+k+\kappa$)

so

Delta($K+k$)≈datum($K+k$)−Anchor($K$)

and

Nonce($K+k+\kappa$)=datum($K+k+\kappa$)−[Anchor($K$)+Delta($K+k$)]

where
- $K$ is the Anchor index at the Anchor update rate,
- $k$ is the Delta index at the Delta update rate,
- $\kappa$ is the Nonce index at the Nonce update rate,
- Nonce update rate≥Delta update rate≥Anchor update rate.

[Note that Nonce($K+k+\kappa$) restores desired precision if $\kappa=0$; provides an intermediate value between Deltas if $\kappa\neq 0$.]

Case 2; A Delta represents the difference between the current datum and the most recent previous datum (reconstructed from the previous Anchor and Deltas). (Delta values may be compromised by purposely reduced word length, or for other reasons):

datum($K+k+\kappa$)=[Anchor($K$)+Delta($K+1$)+ ... +Delta($K+(k-1)$)+Delta($K+k$)]+Nonce($K+k+\kappa$)

so

Delta($K+k$)≈datum($K+k$)−[Anchor($K$)+Delta($K+1$)+ ... +Delta($K+(k-1)$)]

and

Nonce($K+k+\kappa$)=datum($K+k+\kappa$)−[Anchor($K$)+Delta($K+1$)+ ... +Delta($K+(k-1)$)+Delta($K+k$)]

[Again note that Nonce($K+k+\kappa$) restores desired precision if $\kappa=0$; provides an intermediate value between Deltas if $\kappa\neq 0$.]

Or a Nonce may represent some compromise between the two Cases shown above.

In some cases multiple Anchor, Delta, or Nonce values can be represented as "common value plus unique excess", meaning that each of the multiple values can be represented as the sum of the "common" value plus a unique "excess" value. In one non-limiting example, signals that emanate from a single satellite, but share a common frequency (such as L1 and C1, L2 and C2, etc.), may be corrupted similarly by atmospheric effects such that some of their Anchor, Delta, and/or Nonce values lend themselves to this "common value plus unique excess" representation. In another non-limiting example, signals that emanate from multiple different satellites, but share a common frequency, may be corrupted similarly by reference station errors such as clock biases or group delay anomalies, such that some of their Anchor, Delta, and/or Nonce values lend themselves to this "common value plus unique excess" representation. In yet another non-limiting example, signals that emanate from satellites within each GNSS (GPS, GLONASS, Galileo, etc.) may be corrupted similarly by various error sources associated with that GNSS, such that some of their Anchor, Delta, and/or Nonce values lend themselves to this "common value plus unique excess" representation. And in yet another non-limiting example, the basic physics of the situation (due to the similarities in the orbits of all GNSS satellites, and to the fact that multiple signals may emanate from a single satellite) may be such that some of the Anchor, Delta, and/or Nonce values lend themselves to this "common value plus unique excess" representation. To accommodate such cases, a single common value and multiple excess values advantageously can be encoded in lieu of encoding multiple unique values.

Additionally, individual Anchor, Delta, and even Nonce values can be represented as functions of time. This allows any trends in their values over time to be modeled, providing even greater data compression because model parameters may be transmitted instead of raw values of Anchor, Delta, and optional Nonce. The preferred embodiment uses polynomial models, although splines, Fourier coefficients, linear predictors, and the like, can also be used.

The use of trending models implies some knowledge of the expected trends in the data. In one embodiment, such trend information may, for example, be derived by conventional means from knowledge of the satellite orbits and Earth rotation, or from similar information. Or, in the absence of this, past values of individual data elements may be observed for a suitable period of time to establish trends.

The general form of an example embodiment Anchor polynomial model is:

$$\text{Anchor}(K + \Delta K) = A_g + S_{A0}A_0(K) + S_{A1}A_1(K)[t(K+\Delta K) - t(K)] + S_{A2}A_2(K)[t(K+\Delta K) - t(K)]^2 + \ldots$$

Where:
- $A_g$ is a global Anchor bias value
- $A_0(K), A_1(K), A_2(K), \ldots, A_n(K)$ are $0^{th}, 1^{st}, 2^{nd}, \ldots, n^{th}$ order polynomial coefficients at Anchor epoch "K"
- $S_{A0}, S_{A1}, S_{A2}, \ldots, S_{An}$ are scale factors to be applied to $0^{th}, 1^{st}, 2^{nd}, \ldots, n^{th}$ order polynomial terms
- $[t(K+\Delta K)-t(K)]$ is the difference between the time at epoch "$K+\Delta K$" and at epoch "K"

Similarly, the general form of the preferred embodiment Delta polynomial models is:

$$\text{Delta}(K + k + \Delta k) = S_{D0}D_0(K+k) + S_{D1}D_1(K+k)[t(K+k+\Delta k) - t(K+k)] + S_{D2}D_2(K+k)[t(K+k+\Delta k) - t(K+k)]^2 + \ldots$$

Where:
- $D_0(K+k), D_1(K+k), D_2(K+k), \ldots, D_n(K+k)$ are $0^{th}, 1^{st}, 2^{nd}, \ldots, n^{th}$ order polynomial coefficients at Delta epoch "$K+k$"
- $S_{D0}, S_{D1}, S_{D2}, \ldots, S_{Dn}$ are scale factors to be applied to $0^{th}, 1^{st}, 2^{nd}, \ldots, n^{th}$ order polynomial terms
- $[t(K+k+\Delta k)-t(K+k)]$ is the difference between the time at epoch "$K+k+\Delta k$" and at epoch "$K+k$"

Finally, the general form of the preferred embodiment Nonce polynomial models is:

$$\text{Nonce}(K + k + \kappa + \Delta\kappa) =$$
$$S_{N0}N_0(K + k + \kappa) + S_{N1}N_1(K + k + \kappa)[t(K + k + \kappa + \Delta\kappa) - t(K + k + \kappa)] +$$
$$S_{N2}N_2(K + k + \kappa)[t(K + k + \kappa + \Delta\kappa) - t(K + k + \kappa)]^2 + \ldots$$

Where:
$N_0(K+k+\kappa), N_1(K+k+\kappa), N_2(K+k+\kappa), \ldots, N_n(K+k+\kappa)$ are $0^{th}, 1^{st}, 2^{nd}, \ldots, n^{th}$ order polynomial coefficients at Nonce epoch "K+k+κ"

$S_{N0}, S_{N1}, S_{N2}, \ldots, S_{Nn}$ are scale factors to be applied to $0^{th}, 1^{st}, 2^{nd}, \ldots, n^{th}$ order polynomial terms $[t(K+k+\kappa+\Delta\kappa)-t(K+k+\kappa)]$ is the difference between the time at epoch "K+k+κ+Δκκ" and at epoch "K+k+κ"

The expansion of polynomials may be executed according to polynomial principles known in the art, and any elements not present are simply interpreted as zero, so they have no effect of the final value. In an example embodiment the presence or absence of these higher order terms may vary over time, depending upon the characteristics of the data to be transmitted or other influences.

Specifically, in the equations above, depending on changes in the data itself and/or on changes in transmission factors, the maximum order of the polynomial may be dynamically changed, and/or the scale factors may be dynamically changed, and/or the number of bits accorded to each part (anchor, delta, and nonce) may be dynamically changed.

When none of the higher order terms are present in the messages, the associated polynomial coefficients are interpreted as zero and the expansion polynomials reduce to:

$$\text{Anchor}(K+\Delta K) = A_g + S_{A0}A_0(K)$$

$$\text{Delta}(K+k+\Delta k) = S_{D0}D_0(K+k)$$

$$\text{Nonce}(K+k+\kappa+\Delta\kappa) = S_{N0}N_0(K+k+\kappa)$$

with $\Delta K$ typically constrained to be less than the interval between Anchors; $\Delta k$ to be less than the interval between Deltas; $\Delta \kappa$ to be less than the interval between Nonces. Thus the equations used to reconstitute the data reduce to the forms presented earlier:

$$\text{datum}(K + k + \kappa) = [\text{Anchor}(K) + \text{Delta}(K + k)] + \text{Nonce}(K + k + \kappa) \quad \text{Case 1}$$
$$= [A_g + S_{A0}A_0(K)] + [S_{D0}D_0(K + k)] +$$
$$[S_{N0}N_0(K + k + \kappa)]$$

or $$\text{datum}(K + k + \kappa) = [\text{Anchor}(K) + \text{Delta}(K + 1) + \ldots + \quad \text{Case 2}$$
$$\text{Delta}(K + (k - 1))] +$$
$$\text{Delta}(K + k) + \text{Nonce}(K + k + \kappa)$$
$$= [A_g + S_{A0}A_0(K)] + \text{Delta}(K + 1) + \ldots +$$
$$\text{Delta}(K + (k - 1)) +$$
$$[S_{D0}D_0(K + k)] + [S_{N0}N_0(K + k + \kappa)]$$

The configuration and composition of the Anchor, Delta, and optional Nonce Messages, and their transmission rates, both absolute and relative to each other, are determined case-by-case, based upon considerations indicated previously. Those considerations may, in turn, be subject to external influences such as the "class" of user (for example, one class of user may specify Anchors at least every N seconds, while another may be constrained by its medium to Delta Messages not larger then X bits, etc.); the characteristics of the data being transmitted (for example, "ill behaved" data, whether highly dynamic, corrupted by high noise levels, etc., will require more bits than "well behaved" data); and so on. In practice, it is typically the desires of the users that specify the data precision and accuracy required in the reconstituted data, and the message rates are determined by the users' operational needs and limitations. In the preferred embodiment, Anchor Messages are typically broadcast at approximately 60 second intervals, Delta Messages at 1-10 second intervals, and Nonce Messages (if used) at 1 second intervals (chosen to match with the original sample rate of the source data). These constraints, along with the number of signals to be accommodated by each message, are used to configure the models and to allocate the actual bits in the messages.

Generally there is no closed-form mathematical solution to the problem of fitting the information associated with the Range Data or parameters to the available message capacity, so search or heuristic methods must be employed.

It was stated earlier that, for present purposes, it was assumed that both the encoding entity and the decoding entity are aware of the basic parameters of the coding process (fundamentals such as modulation type, synchronization words, location and interpretation of header information, the meaning assigned the individual bits in a message payload structure, encryption, etc.). In an example implementation the basic parameters of the coding process are incorporated into "Encoding Parameter" messages that are transmitted periodically by the Reference Station, encrypted if desired in part or in total, for receipt by the Rovers. Persons skilled in the art will recognize that other means by which the basic parameters may be made known to all interested parties are possible.

In particular, in some embodiments Encoding Parameter Messages are established that contain such information as indications of which GNSS satellites and associated signal types (for example; L1, L2, C1, C2, etc.) are being observed (hereafter designated "Satellite Signals"), the configuration of the Range Data themselves (for example; whether pseudo-ranges, range-rates, range corrections, parameters, etc.), configuration of individual Anchor, Delta, and optional Nonce models (for example; model orders), how all of the transmitted information is packed into the message, and so on. There may be a single Encoding Parameter Message that applies to all Satellite Signals; or there may be multiple separately transmitted Encoding Parameter Messages, each of which applies to a subset of Satellite Signals; or there may be one separately transmitted Encoding Parameter Message associated with each Satellite Signal.

Regardless of the configuration of Encoding Parameter Messages, the aforementioned basic parameters of the coding process associated with each Satellite Signal may be unique, such that the compression of each Satellite Signal is customized; or any particular set of basic parameters may be configured so as to be applicable to multiple Satellite Signals, such that overall Encoding Parameter Message size is reduced.

The contents of Encoding Parameter Messages might change very little during the time that any particular GNSS satellite is visible above the horizon, so on that basis it would not be necessary to transmit Encoding Parameter Messages very often. However, as a practical matter Rovers and other users begin receiving Reference Station messages, or lose and regain Reference Station signals, at random times, so it is necessary to broadcast Encoding Parameters messages much more frequently than content changes would indicate, so as to reduce "startup delay". Selection of the interval between Encoding Parameter Message broadcasts is a compromise between the maximum tolerable startup delay and the data payload. In the preferred embodiment the interval is generally on the order of 60 seconds.

In an example preferred embodiment, Encoding Parameter Messages can be combined with Anchor and (optionally) Delta and Nonce Messages in what are known as "Key Frame" messages, such that a Key Frame contains all of the information needed for a Rover to begin receiving messages, or to re-synchronize in the case of message signal interruption, and decode Range Data. Each Key Frame is entirely independent of all other Key Frames, and each constitutes a complete "reset" of all system parameters for the signals that it describes.

Some systems provide alternate transmission channels intended for sporadic, on-demand use. In such systems it may be possible to shorten the length of time needed to synchronize or re-synchronize by transmitting Key Frames to Rovers via these alternate channels more frequently than the basic Key Frame rate, or asynchronously in response to individual Rover requests.

Hereafter, Key Frame, Encoding Parameter, Anchor, Delta, and/or Nonce Messages, collectively or individually, are designated "Correction Messages".

It is often the case that some external information is available about the data to be transmitted. This is especially true for GNS systems where information such as the orbital ephemerides (which are available in multiple formats from multiple sources) can be combined with the current observed and historical measurements to provide more optimal selection of Anchor and Delta values In such cases the Range Data are reviewed and adjusted in light of additional information provided about the Satellite Signal source by external information such as orbital behaviors or other limits associated with the data. During some periods of operation such external information may not be present in which case this process is skipped. At other times the information becomes available while operating, such as the case of receiving updated orbital data. At still other times the information about a given Satellite Signal is simply hard-coded in a fashion similar to various systems settings. As an exemplary detail, in the preferred embodiment, for GPS and GLONASS systems, the orbital perigee (and hence the minimum possible pseudorange) for any satellite is about 19,500 km. The Anchor value for the pseudorange will thus never be less than this amount. And as this value is known by both the sender and receiver, it need never be sent, and this becomes the $A_g$ term previously described.

The more typical use of the external data is to describe evolving trends in the data set without the influence of measurement noise. Recognizing that the pseudorange measurement in essence is an orbital range value corrupted by various combinations of delay caused by evolving influences such as changes within the ionosphere or troposphere, present principles recognize that the future trend estimate provided by the external data is more reliable than any given short term trend estimate that is based on noise corrupted data.

In the preferred embodiment the available orbital data about the trends in the measurements can be used to determine longevity of Anchor values and/or when to change the Anchor points, or to estimate the current range and range-rate for the pseudorange measurements. In the preferred embodiment, and in general when such external data are available, use of such external data is preferred over similar information derived strictly from the measurements.

Adaptive Encoding of Parameters

Unlike DGNS systems in which message composition and data contents can be set appropriately for a variety of different situations, but once set, they cannot be changed, as contemplated herein message composition and data contents are automatically changed while the system is operating to adapt to changing situations, conditions, requirements, data trends, and the like.

In a preferred embodiment, characteristics such as Encoding Parameters, particularly Anchor/Delta/Nonce configuration (number of bits in each, frequency of transmission, etc.), data model configuration (model order, scaling constant values, etc.), and achievable fidelity of reconstituted data, are adaptively varied to provide the best representation of the data at any given time. As opposed to adaptive systems that in general seek to minimize a "cost function", e.g., the number of bits in the message to be transmitted, present principles do not necessarily seek to minimize the number of bits to be transmitted (though in cases where minimal message size is required this can be achieved), but instead seek to maximize the quality of the representation of the data being transmitted within the constraint of the available number of bits to be transmitted.

Also, by means of adaptation, variations in the definition of "best representation of the data" over time can be accommodated. For example, atmospheric effects reduce the achievable accuracy of pseudoranges when satellites are observed close to the horizon, so in one example embodiment one or more of the parameters discussed above is adjusted to devote a smaller or larger portion of the message payload to data from satellites that move toward or away from the horizon as time passes.

To implement the above-discussed adaptive aspects, partial or even complete reconfiguration of any or all parameters at any time, identification and exploitation of redundant data, and single-instance "exception" handing can be effected to reduce average or instantaneous message size, to increase the fidelity of reconstituted data, to enhance the ability of data trending models to predict future values, and/or to reduce the time required for a user to begin receiving data or to resume receiving data after signal loss.

One adaptive aspect is the ability to identify and use redundant Anchor data. Particularly in cases where trending models are used, some or all Anchor data may be expected to be constant for multiple Anchor epochs. In such situations, one of two benefits may be realized, depending upon specific needs:

1. In cases where time to resume receiving data after Correction Message loss is critical, a parameter in each Anchor Message may be set that indicates "this Anchor value will remain constant until Anchor epoch N". Thus, a user that receives an Anchor Message containing this constant Anchor value and parameter, then misses one or more Anchor Messages, then receives Delta Messages that are referenced to the original constant Anchor value, can begin reconstituting data immediately instead of having to wait until receipt of a future Anchor Message.
2. In cases where time to resume receiving data after Correction Message loss is not critical, the constant Anchor value may be transmitted in an initial Anchor Message, then omitted from subsequent messages, thus saving the bits required to represent that same constant Anchor value in those subsequent messages.

An adaptive aspect of one preferred embodiment is the ability to change the parameters of Anchor/Delta/Nonce values, models, and transmission rates according to changing needs. It is likely that there will be more than one combination of Anchor, Delta, and Nonce transmission scheme (rates, composition, model parameters, etc.) that will satisfy the requirements for transmission of the data. One or more of them is likely to fit within the available bits to be transmitted. Over time, however, as the data and/or transmission requirements change, one or more of the transmission schemes that had been appropriate (particularly the actual scheme in use) no longer will be appropriate. However, different transmission schemes may become available that are appropriate for the new situation. The adaptability described herein enables the adoption of a different, appropriate transmission scheme automatically, resulting in uninterrupted operation and uncompromised performance.

Anomalous Condition Handling

A further aspect is the identification and accommodation of instances of "exceptional" data; data that, for some reason, do not fit within the parameters of the current encoding scheme. Whenever any data value falls outside the range that can be represented by its current message bit allocation, the concept of "extension data" is employed to extend the range of the value in question during the exception (if sufficient unused message bits remain), or to indicate that the value cannot be represented, is corrupted, or missing.

The ability to accommodate such anomalies by use of the exception process means that "exceptional" data are not necessarily lost, while the ability to send new Anchor information, or even Encoding Parameters, at the next associated epoch means that the system can adapt to changing conditions gracefully, so that a new system configuration can be employed to accommodate what were "exceptional" data in the past. Accordingly, the present compression approach adapts to the data that it is processing.

Another aspect is the ability to anticipate the addition or removal of signals according to the periodicities of the satellites to be observed. The present compression approach, which can automatically adapt to the presence of new data elements with an appropriate transmission scheme, results in uninterrupted operation and uncompromised performance.

Advantages of the Preferred Embodiment Configuration

A device built in accordance with present principles, by means of use of its independently adjustable scaling factors (the terms marked $S_{A0}$, $S_{D0}$, and $S_{N0}$ in the model equations), can allow for different resolutions and precision levels in the Anchor, Delta, and Nonce elements. This allows, for example, multiple users of the same data, having different precision requirements, to utilize the same messages. A user requiring very low precision can reconstitute the data from the Anchors alone, whereas a user requiring moderate precision can reconstitute the data from the Anchors and Deltas but ignore the Nonces. Yet again, a user requiring high precision can reconstruct the data from the Anchors and Deltas, then add the Nonces to supply the required high precision.

A device built in accordance with present principles can be used to advantage in situations where message loss or data dropout prevents reception of one or more Delta Messages, because the trend models, projected into the future, can provide better estimates of the "lost" data values than simply holding the last received values.

It can be difficult to determine and predict model trends from data that are corrupted by measurement noise. A device built in accordance with principles herein can take advantage of such trending information when available, but still operate and compress arbitrary data in its absence.

Additionally, a device built in accordance with disclosure herein can select the compressed message payload contents to achieve a balance between message content, bit size representation of various data element values, and various update rates driven by the evolving measurement trends observed in the data themselves (such as the rate of error accumulated from the point of prior transmissions). In this way opportunistic compression and assembly of message content for a given GNSS Satellite Signal or set of Signals is provided in response the rapidly changing conditions.

The preferred embodiment device is further capable of determining (and announcing to the Rover by means of the message contents), the provisioning to be used for bit level data compression of individual data elements which may vary between the collection of orbiting GNSS satellites for which data are then being provided. In this way the invention differs from most other compression approaches which typically select a single compression operating point for use on a plurality of similar data elements regardless of their current operating conditions (measurement noise, trends etc.).

The present reference device can announce and describe to rovers the compression format then being used for any Satellite Signal using the Encoding Parameters Message contents, by means of an index to a mutually shared list of such formats, or by sending this information over various auxiliary communications methods to the rover. Also, the present reference device can quickly adapt to, and gracefully transmit data for, a measurement that exceeds dynamic ranges and encoding limits previously established for its encoding format. This is in contrast to compression approaches which select a single compression operating point for use on a plurality of similar data elements regardless of their current operating conditions (measurement noise, trends etc.). Furthermore, the present description provides for reconstructing a current value from a single Delta and its corresponding Anchor. A rover need not have correctly received all intervening Delta, Nonce, or Anchor values. This provides a high level immunity to message losses commonly experienced in mobile communications.

A rover device built in accordance with present description can reconstruct the current value from a prior Delta and its corresponding Anchor when various data model elements are part of the Delta Message. This provides a high level immunity to message losses commonly experienced in mobile communications. Accordingly, the preferred embodiment device, by means of adaptive element level data and message compression methods, is capable of reducing the overall size of source message streams for transmission to a remote point and then reconstructing the source message itself or variations thereof.

An Example

The data presented Table 1 are used to formulate a non-limiting example of principles discussed above. The first column is a count of the seconds from an arbitrary starting point at 5:30 AM, the second column contains the Time of Day (TOD) in seconds from GPS midnight, while the final column contains the observed pseudorange from the observer's position to the satellite, at that time, in units of meters. The data follow the convention of RINEX with a resolution of 0.001 meter, even though the original source data (an RTCM 3.x message in this case) can have a different resolution (e.g., 2 cm).

TABLE 1

Representative Pseudorange values from a satellite for a segment of the orbit

| Clock | | C1 |
| --- | --- | --- |
| Time (sec) | TOD (sec) | Measurement (meters) |
| −30 | 19,770 | 25,154,990.420 |
| −29 | 19,771 | 25,154,287.540 |
| −28 | 19,772 | 25,153,584.620 |
| −27 | 19,773 | 25,152,881.640 |
| −26 | 19,774 | 25,152,178.660 |
| −25 | 19,775 | 25,151,475.620 |

TABLE 1-continued

Representative Pseudorange values from a satellite for a segment of the orbit

| Clock Time (sec) | TOD (sec) | C1 Measurement (meters) |
|---|---|---|
| −24 | 19,776 | 25,150,772.560 |
| −23 | 19,777 | 25,150,069.440 |
| −22 | 19,778 | 25,149,366.260 |
| −21 | 19,779 | 25,148,663.100 |
| −20 | 19,780 | 25,147,959.900 |
| −19 | 19,781 | 25,147,256.740 |
| −18 | 19,782 | 25,146,553.540 |
| −17 | 19,783 | 25,145,850.380 |
| −16 | 19,784 | 25,145,147.200 |
| −15 | 19,785 | 25,144,444.020 |
| −14 | 19,786 | 25,143,740.800 |
| −13 | 19,787 | 25,143,037.540 |
| −12 | 19,788 | 25,142,334.200 |
| −11 | 19,789 | 25,141,630.740 |
| −10 | 19,790 | 25,140,927.300 |
| −9 | 19,791 | 25,140,223.800 |
| −8 | 19,792 | 25,139,520.260 |
| −7 | 19,793 | 25,138,816.680 |
| −6 | 19,794 | 25,138,113.080 |
| −5 | 19,795 | 25,137,409.440 |
| −4 | 19,796 | 25,136,705.760 |
| −3 | 19,797 | 25,136,002.000 |
| −2 | 19,798 | 25,135,298.220 |
| −1 | 19,799 | 25,134,594.480 |
| 5:30 AM | 19,800 | 25,133,890.700 |
| 1 | 19,801 | 25,133,186.900 |
| 2 | 19,802 | 25,132,483.020 |
| 3 | 19,803 | 25,131,779.160 |
| 4 | 19,804 | 25,131,075.240 |
| 5 | 19,805 | 25,130,371.260 |
| 6 | 19,806 | 25,129,667.240 |
| 7 | 19,807 | 25,128,963.240 |
| 8 | 19,808 | 25,128,259.200 |
| 9 | 19,809 | 25,127,555.160 |
| 10 | 19,810 | 25,126,851.080 |
| 11 | 19,811 | 25,126,146.980 |
| 12 | 19,812 | 25,125,442.840 |
| 13 | 19,813 | 25,124,738.680 |
| 14 | 19,814 | 25,124,034.480 |
| 15 | 19,815 | 25,123,330.220 |
| 58 | 19,858 | 25,093,017.820 |
| 59 | 19,859 | 25,092,312.260 |
| 5:31 AM | 19,860 | 25,091,606.680 |
| 61 | 19,861 | 25,090,901.040 |
| 119 | 19,919 | 25,049,923.100 |
| 5:32 AM | 19,920 | 25,049,215.740 |
| 121 | 19,921 | 25,048,508.340 |
| 179 | 19,979 | 25,007,428.220 |
| 5:33 AM | 19,980 | 25,006,719.120 |
| 181 | 19,981 | 25,006,009.940 |
| 239 | 20,039 | 24,964,832.860 |
| 5:34 AM | 20,040 | 24,964,122.140 |

This table of representative values is used to perform the process disclosed, to determine suitable values for use in the Anchor and Delta value sets. For illustrative purposes, the major scaling factors for all values will be set to 1.0 in all cases. In an example preferred embodiment these scaling factors are set to support the least significant bit (LSB) of the source data (hence preserving its precision) and to set the scales of various higher order rates to be a value which can be divided by a $2^N$ scaling factor. An exception to this can be made when the population of rover devices does not require the original precision of the source data. Under such operating conditions a coarser scaling and unit LSB may be selected for the Delta with an inherent further reduction in the message payload size. The use of RTK grade of corrections transmitted to single difference L1 only rover devices would be such an example.

For purposes of this illustrative example, new Anchor information (which is contained in a Key Frame message) is issued every 60 seconds, or every $60^{th}$ message; the Anchor Epoch. As disclosed, the data in this message may simply restate the last set of Anchor values used, or may update those values with new data to be used thenceforth. In any event, the values are used until replaced with more current information. The choice of how often to issue the Key Frame message is a compromise between the compression that can be achieved (fewer Anchors=more compression) and the time delay that a new user to the system would experience until the reception of the Anchor information (which is required to understand and use the more frequently sent stream of Delta messages). The Delta messages may be sent every second, one for each data measurement; the Delta Epoch. In the preferred embodiment, sets of Anchors and Deltas for a plurality of signals at the same point in time may be combined into each Key Frame and Delta message.

Considering these data in the abstract (that is, without any awareness that they represent a pseudorange for a known satellite with a known orbit), several key observations can be made. They are trending monotonically downward in steps of approximately 703 meters per second, without gross changes in the trend, and with rate of change that is mildly increasing. These facts can be established by examination of the data prior to the time 5:30 AM (TOD=19,800). It is also evident that a resolution of 0.001 is present (but not used) and that at 5:30 AM an Anchor point reflecting the current measurement value (25,133,890.700 meters) could be used.

If these observations are used to create an Anchor/Delta system, as disclosed above, where the current Anchor is 25,133,890.700 meters, the current Anchor rate is −703.0 meters/second, and the resolution of 0.02 is to be kept (the actual precision present in the data), then the Delta values (which will all be negative) for the next several measurements will be as follows

TABLE 2

Expression of delta values against anchor issued at 5:30 AM

| Time | TOW (seconds) | Range (meters) | Delta (meters) | Delta in LSB Units |
|---|---|---|---|---|
| 5:30 AM | 19,800 | 25,133,890.700 | 0.000 | 0 |
| 1 | 19,801 | 25,133,186.900 | −0.800 | −40 |
| 2 | 19,802 | 25,132,483.020 | −1.680 | −84 |
| 3 | 19,803 | 25,131,779.160 | −2.540 | −127 |
| 4 | 19,804 | 25,131,075.240 | −3.460 | −173 |
| 5 | 19,805 | 25,130,371.260 | −4.440 | −222 |
| 6 | 19,806 | 25,129,667.240 | −5.460 | −273 |
| 7 | 19,807 | 25,128,963.240 | −6.460 | −323 |
| 8 | 19,808 | 25,128,259.200 | −7.500 | −375 |
| 9 | 19,809 | 25,127,555.160 | −8.540 | −427 |
| 10 | 19,810 | 25,126,851.080 | −9.620 | −481 |
| — | — | — | — | — |
| 58 | 19,858 | 25,093,017.820 | −98.880 | −4,944 |
| 59 | 19,859 | 25,092,312.260 | −101.440 | −5,072 |
| 60 | 19,860 | 25,091,606.680 | −104.020 | −5,201 |
| 90 | 19,890 | 25,070,424.320 | −196.380 | −9,819 |
| 120 | 19,920 | 25,049,215.740 | −314.960 | −15,748 |
| 180 | 19,980 | 25,006,719.120 | −631.580 | −31,579 |
| 240 | 20,040 | 24,964,122.140 | −1048.560 | −52,428 |

By the $59^{th}$ Delta value the divergence in the measurements has caused the Delta value to grow to be −101.44 meters. If this process were to continue for another ~240 measurements with the same Anchor, the Delta value would then be −1048.56 meters. It is evident that the more frequently exchanged Delta values are constrained to a smaller range than the original measurement data. If these numbers are expressed as integers with an LSB that represents 2 cm (as shown in the right column) then the Delta value of −5072 can easily be expressed as a 13 bit value (accompanied by a suitable scaling factor). After 240 measurements the Delta value of −52,428 (representing −1048.560 meters) would require 16 bits to represent.

If, by comparison, the original raw measurements were expressed as 32 bit floating point values, then 240 such measurements would require 7,680 bits to represent. If 16 bit Deltas were used with 32 bit floating point values for the Anchor and Anchor Rate, then 3888 bits would be required (a 50% reduction). In this example the Anchor was not reissued every $60^{th}$ measurement but the initial Anchor value selected was used to express all 240 measurements. If the Anchor was reissued on the $60^{th}$ second epoch then the maximum Delta range to be supported (5072 at the $59^{th}$ point in this case) could be represented by a 13 bit value. The required bits would then be 3299, a further improvement, offset by the cost of two additional Anchor messages. If a more suitable value of Anchor rate was chosen to represent the middle point of the measurement interval (say 704.7 m/s but not yet taking the $2^{nd}$-order acceleration effects into account), then the required range for the Delta value would be reduced to 10 bits and the total equivalent payload would become 2582 bits (66% reduction). A table using these values would then be:

| Time | TOW | Range | Delta | Delta in LSB Units |
|---|---|---|---|---|
| 5:30 AM | 19,800 | 25,133,890.700 | 0.0000 | 0 |
| 1 | 19,801 | 25,133,186.900 | 0.9000 | 45 |
| 2 | 19,802 | 25,132,483.020 | 1.7200 | 86 |
| 3 | 19,803 | 25,131,779.160 | 2.5600 | 128 |
| 4 | 19,804 | 25,131,075.240 | 3.3400 | 167 |
| 5 | 19,805 | 25,130,371.260 | 4.0600 | 203 |
| 6 | 19,806 | 25,129,667.240 | 4.7400 | 237 |
| 7 | 19,807 | 25,128,963.240 | 5.4400 | 272 |
| 8 | 19,808 | 25,128,259.200 | 6.1000 | 305 |
| 9 | 19,809 | 25,127,555.160 | 6.7600 | 338 |
| 10 | 19,810 | 25,126,851.080 | 7.3800 | 369 |

The binary Delta shown here is again composed LSB units of 0.02 for a value expressed in meters. In practice the precise value of the Delta cannot be determined until the Anchor itself has first been determined. The relationship of the Delta to the Anchor is made more complex by the scaling factors involved. The value selected for the Anchor itself may have less precision then the Delta, which must be accounted for in the Delta value in some embodiments. The values chosen for the rate and acceleration elements are typically very small in magnitude when compared with the Anchors, and this adds additional scaling factors that must be exchanged in a compression details message or be mutually known by all parties (reference stations and rovers).

In one preferred embodiment, if Anchor rates are to be used then any data that are to be handled when no external information about their expected future properties is available must be observed for a period of time sufficient to establish trending. The selected Anchor rate value should reflect the average expected rate over the period of the Anchor's anticipated use. It will be observed that there is no bit-sizing advantage in selecting a rate that causes the stream of Deltas to be unsigned or constant sign, as the resulting increase in required range offsets the savings of the sign bit. It should be further observed that an Anchor index mechanism in the Key Frame allows the values established on a prior (unchanged) Anchor to be propagated forward at the point a new Anchor would otherwise be issued.

In one preferred example embodiment, the available orbital data about the trends in the measurements may be used to determine when to change in the Anchor point, and the current rate and acceleration for the signal at the point in time mid-way between the current Anchor epoch and the next Anchor epoch. Similar estimates of the anticipated Anchor information can be created for trends over the next N Anchor intervals by fitting the Anchor or Delta value sets to the orbital data, using curve-fitting methods known in the art.

Using an example with $2^{nd}$ order terms in the Anchor, one can issue suitable Anchor data as follows: for this initial instance the value at time 5:30 AM (TOD=19,800) can be chosen to be . . .
$A_0$=05,633,890.70 m
$A_g$=19,500,000.00 m
$A_1$=−703.8 m/s
$A_2$=−0.015 m/s$^2$
Epochs of expected use=3 (180 measurement samples)
Anchor Epoch index=mod(Anchor Epoch index+1, 8)

If these values are then issued in the current Anchor value set, the resulting Delta values (using only a zero-order constant term for the Delta value set) would be as follows Delta Elements when using a $2^{nd}$ order Anchor value set.

| Time (sec) | Current Anchor (m) | Composite Delta (m) | In 2 cm LSB Units |
|---|---|---|---|
| 0 | 25,133,890.700 | 0.0000 | 0 |
| 1 | 25,133,186.885 | 0.0150 | 1 |
| 2 | 25,132,483.040 | −0.0200 | −1 |
| 3 | 25,131,779.165 | −0.0050 | 0 |
| 4 | 25,131,075.260 | −0.0200 | −1 |
| 5 | 25,130,371.325 | −0.0650 | −3 |
| 6 | 25,129,667.360 | −0.1200 | −6 |
| 7 | 25,128,963.365 | −0.1250 | −6 |
| 8 | 25,128,259.340 | −0.1400 | −7 |
| 9 | 25,127,555.285 | −0.1250 | −6 |
| 10 | 25,126,851.200 | −0.1200 | −6 |
| 11 | 25,126,147.085 | −0.1050 | −5 |
| 12 | 25,125,442.940 | −0.1000 | −5 |
| 13 | 25,124,738.765 | −0.0850 | −4 |
| 14 | 25,124,034.560 | −0.0800 | −4 |
| 15 | 25,123,330.325 | −0.1050 | −5 |
| 16 | 25,122,626.060 | −0.1600 | −8 |
| 17 | 25,121,921.765 | −0.2050 | −10 |
| 18 | 25,121,217.440 | −0.2200 | −11 |
| 19 | 25,120,513.085 | −0.3050 | −15 |
| 20 | 25,119,808.700 | −0.3600 | −18 |
| 21 | 25,119,104.285 | −0.3850 | −19 |
| 22 | 25,118,399.840 | −0.4000 | −20 |
| 23 | 25,117,695.365 | −0.4650 | −23 |
| 24 | 25,116,990.860 | −0.5400 | −27 |
| 25 | 25,116,286.325 | −0.6050 | −30 |
| 26 | 25,115,581.760 | −0.6800 | −34 |
| 27 | 25,114,877.165 | −0.7650 | −38 |
| 28 | 25,114,172.540 | −0.8400 | −42 |
| 29 | 25,113,467.885 | −0.8850 | −44 |
| 30 | 25,112,763.200 | −1.0000 | −50 |
| 31 | 25,112,058.485 | −1.0850 | −54 |
| 32 | 25,111,353.740 | −1.1400 | −57 |
| 33 | 25,110,648.965 | −1.1450 | −57 |
| 34 | 25,109,944.160 | −1.1600 | −58 |
| 35 | 25,109,239.325 | −1.1450 | −57 |
| 36 | 25,108,534.460 | −1.1400 | −57 |
| 37 | 25,107,829.565 | −1.1650 | −58 |
| 38 | 25,107,124.640 | −1.1800 | −59 |
| 39 | 25,106,419.685 | −1.2050 | −60 |
| 40 | 25,105,714.700 | −1.2200 | −61 |
| 41 | 25,105,009.685 | −1.2250 | −61 |
| 42 | 25,104,304.640 | −1.2400 | −62 |
| 43 | 25,103,599.565 | −1.2250 | −61 |

-continued

| Time (sec) | Current Anchor (m) | Composite Delta (m) | In 2 cm LSB Units |
|---|---|---|---|
| 44 | 25,102,894.460 | −1.2400 | −62 |
| 45 | 25,102,189.325 | −1.2450 | −62 |
| 46 | 25,101,484.160 | −1.3000 | −65 |
| 47 | 25,100,778.965 | −1.3650 | −68 |
| 48 | 25,100,073.740 | −1.4600 | −73 |
| 49 | 25,099,368.485 | −1.5650 | −78 |
| 50 | 25,098,663.200 | −1.6400 | −82 |
| 51 | 25,097,957.885 | −1.7050 | −85 |
| 52 | 25,097,252.540 | −1.7600 | −88 |
| 53 | 25,096,547.165 | −1.8450 | −92 |
| 54 | 25,095,841.760 | −1.8800 | −94 |
| 55 | 25,095,136.325 | −1.9450 | −97 |
| 56 | 25,094,430.860 | −2.0000 | −100 |
| 57 | 25,093,725.365 | −2.0450 | −102 |
| 58 | 25,093,019.840 | −2.0200 | −101 |
| 59 | 25,092,314.285 | −2.0250 | −101 |
| 60 | 25,091,608.700 | −2.0200 | −101 |
| 61 | 25,090,903.085 | −2.0450 | −102 |
| 119 | 25,049,926.085 | −2.9850 | −149 |
| 120 | 25,049,218.700 | −2.9600 | −148 |
| 121 | 25,048,511.285 | −2.9450 | −147 |
| 179 | 25,007,429.885 | −1.6650 | −83 |
| 180 | 25,006,720.700 | −1.5800 | −79 |
| 181 | 25,006,011.485 | −1.5450 | −77 |
| 239 | 24,964,825.685 | 7.1750 | 359 |
| 240 | 24,964,114.700 | 7.4400 | 372 |

As can observed, the bit width required for the Delta value range is further reduced from the prior example, producing a savings in message payload. Here we can represent each of the 180 delta values over a 3 minute interval with a 9 bit value. If this was to be extended to a $4^{th}$ minute, then the final eleven Delta values would require a single additional bit. This might also be handled by allowing a small Delta rate term to be sent as well.

It is to be understood that the above principles also apply to nonce values when used. In such instances nonce values are established according to above principles and transmitted more frequently than delta values. In some cases nonce values are transmitted at the same rate as delta values.

The above principles also illustrate why the present application gracefully accounts for anomalous conditions such as out of range data values. For example, if a range value is observed that is not expected from the observed trend in the data, a new anchor value may be sent to the rover ahead of schedule, and new model orders and/or scaling factors and/or bit widths can be calculated at the reference station and sent to the rover in a message to enable the rover to properly decode the information. In cases where there are only a small number of out-of-range values, or when it is not possible to immediately change the message parameters, the "extension bits" may be used to provide immediate data values covering the temporary anomalous conditions.

The above principles also apply to changes in transmission conditions as well as to changes in data. For example, if the rover experiences degraded signal to noise ratio (SNR) or other indication of changing transmission conditions such as improving or degrading bit error rates (BER), it can send a message to the reference station so stating. Note that if there is not two-way communication between the rovers and the reference station, a designated device (often called an auxiliary reference station) located away from the reference station can be used to monitor the end-to-end quality of the transmissions, and thereby enable a means of informing the reference station of any impairments in the delivery of corrections data or reception thereof.

In turn, the reference station can alter the compression accordingly and inform the rover of the new compression. By way of non-limiting example, in the presence of degrading transmission conditions the model order can be reduced, and/or anchor values can be sent more or less frequently. Scaling factors can be made coarser for degraded conditions and more refined for improved conditions. However, it is to be understood that which direction (increase or decrease, more or less frequently, coarser or finer, etc.) to modify the parameters in response to a degradation of transmission conditions can be determined on a case-by-case basis.

While the particular METHOD AND APPARATUS FOR REDUCING SATELLITE POSITION MESSAGE PAYLOAD BY ADAPTIVE DATA COMPRESSION TECHNIQUES is herein shown and described in detail, it is to be understood that the subject matter which is encompassed by the present invention is limited only by the claims.

What is claimed is:

1. A device comprising a transmitter and at least one receiver:
   the transmitter configured for at least one of obtaining and determining data elements from one or more sources, the data elements representing measurements or other information associated with one or more entities, and by means of data compression and encoding, representing an ensemble of the data elements as a set of messages that are transmitted via one or more suitable transmission media, and
   the receiver configured for receiving, decoding, and decompressing messages created by the transmitter so as to reconstitute data elements contained within the messages, and further configured for deriving and evaluating the measurements or other information represented by the reconstituted data elements, such that a composite size of the messages is significantly smaller than a composite size of a set of messages representing the same data elements in an uncompressed form, and
   the transmitter being configured for controlling an achievable fidelity of reconstitution of the data elements, by the receiver, by means of an alteration of one or more parameters in the data compression and encoding, and
   the transmitter being configured for adaptation of compression and/or encoding parameters in response to changing requirements, situations, or data, and
   the transmitter and receiver being configured for accommodation of one or more anomalous data elements that cannot be represented by the encoding, such anomalous elements being identified by means of signals encoded in the messages.

2. The device of claim 1, wherein the data elements include range, range-rate, range corrections, or quantities related to range, and corresponding times, or parameters used in the determination thereof, associated with observations of one or more GNSS satellites by one or more GNSS reference stations at fixed locations on the surface of the Earth, or
   the data elements include parametric models or other representations that are functions of time, and from which range, range-rate, range corrections, or quantities related to range, and corresponding times, or parameters used in the determination thereof, are derived by evaluation of the parametric models or other representations, and
   the messages represent information that is transmitted by one or more GNSS reference stations to one or more mobile or stationary GNSS rovers via one or more transmission media, as a part of an implementation of GNSS differential range correction.

3. The device of claim 2, wherein compression and encoding parameters are known to both the transmitter and the receiver because:
   a. compression and encoding parameters are predetermined and either fixed, or changed according to a schedule, or
   b. compression and encoding parameter values are changed by the transmitter, then transmitted to the receiver when changed, or
   c. compression and encoding parameter values are changed by external entities, then conveyed to the transmitter and the receiver when changed.

4. The device of claim 3, wherein compression and encoding parameters associated with each GNSS satellite signal are unique to each signal.

5. The device of claim 3, wherein some or all of a set of compression or encoding parameters are shared among more than one GNSS satellite signals.

6. The device of claim 5, wherein the transmitter transmits one or more sets of compression or encoding parameters to the receiver by means of an index to a mutually shared table or list of such parameters.

7. The device of claim 3, wherein the transmitter transmits one or more sets of compression or encoding parameters to the receiver by means or one or more auxiliary communications methods.

8. The device of claim 3, wherein compression or encoding parameter values are transmitted more frequently than a rate at which the values actually change, such that an amount of time that passes between when the receiver begins to receive data messages from the transmitter, and when the receiver has received a complete data message and begins decoding, is thereby reduced.

9. The device of claim 2, wherein data elements are decomposed into:
   a. a set of long-term values, represented at full or at reduced numerical accuracy;
   values or representations of which are transmitted infrequently, and
   b. a set of short-term values, represented at full or at reduced numerical accuracy; values or representations of which are transmitted frequently, and
   c. a set of residuals; values or representations of which are transmitted as necessary, that provide instantaneous corrections to data elements reconstituted only from the long-term and short-term values such that reconstituted data elements match original data elements to within an increased numerical accuracy.

10. The device of claim 9, wherein the set of long-term values represents full quantities of corresponding original data elements, to within a desired numerical accuracy.

11. The device of claim 9, wherein the set of short-term values represents differences between a set of current data elements and a corresponding set of recent previous data elements, to within a desired numerical accuracy.

12. The device of claim 11, wherein the set of short-term values represents differences between a set of current data elements and a most recently transmitted set of long-term values.

13. The device of claim 12, wherein reconstitution of the set of current data elements depends only upon a set of short-term values and the most recently transmitted set of long-term values, such that reconstitution of the set of current data elements is possible even in cases where one or multiple more-recently transmitted sets of short-term values has not been received.

14. The device of claim 11, wherein the set of short-term values represents differences between a set of current data elements and a sum of a most recently transmitted set of long-term values and at least one set of recently transmitted short-term values.

15. The device of claim 11, wherein compression is achieved because the differences have smaller magnitudes than corresponding full quantities of the current data elements, and thus encoding of differences results in a smaller message payload than does encoding of full quantities of data elements.

16. The device of claim 9, wherein the set of residuals represents differences between a set of current data elements and:
   a. a most recently transmitted set of long-term values, or
   b. a sum of a most recently transmitted set of long-term values and at least one recently transmitted set of short-term values.

17. The device of claim 9, wherein multiple individual long-term, short-term, or residual values are decomposed into a sum of a value common to all the individual values and an excess value unique to each the individual value, and transmitted in lieu of the multiple individual values.

18. The device of claim 17, wherein data compression is achieved because fewer message bits are required to represent the single common value and multiple unique excess values than are required to represent the multiple individual values.

19. The device of claim 9, wherein:
   a. long-term values are transmitted at a rate based upon a rate at which the data elements change, a fidelity with which the reconstituted data elements must match the original data elements, some constraints upon transmission bandwidth or data payload, or an ability of the receiver to tolerate data starvation, and
   b. short-term values are transmitted at a rate based upon a rate at which the data elements change, a fidelity with which the reconstituted data elements must match the original data elements, some constraints upon transmission bandwidth or data payload, or an ability of the receiver to tolerate data starvation, and
   c. residual values are transmitted at a rate based upon a fidelity with which the reconstituted data elements must match the original data elements, or some constraints upon transmission bandwidth or data payload.

20. The device of claim 19, wherein compression is achieved because encoding of the parameters results in smaller message payload than does encoding of values from which models or other representations are derived.

21. The device of claim 9, wherein:
   a. data elements consist of parametric models or other representations that are functions of time, and
   b. parameters of the parametric models or other representations are transmitted instead of values that parametric models or other representations represent, and
   c. the receiver is configured for evaluation of the parametric models or other representations, and the parametric models or other representations are evaluated by the receiver with respect to a current time or with respect to a past time, to reconstitute associated values that parametric models or other representations represent, to within a desired numerical accuracy, or
   d. the receiver is configured for evaluation of the parametric models or other representations, and the parametric models or other representations are evaluated by the receiver with respect to a future time, to estimate future values that parametric models or other representations represent.

22. The device of claim 21, wherein the parametric models or other representations are used to estimate future values, and the receiver is configured to tolerate periods of data starvation by utilizing the estimated future values in lieu of some missing measured future values, in an event of inability to receive one or more signals from the transmitter or purposeful reduction in transmission rates of long-term values, short-term values, or residuals.

23. The device of claim 19, wherein each the parametric model or other representation incorporates an independent set of scale factors for each of long-term values, short-term values, and residuals.

24. The device of claim 19, wherein the device further comprises means for adapting its configuration to exploit trending information regarding data elements when available, or to remain operable when the trending information is absent.

25. The device of claim 9, wherein one or more long-term values remain constant for some periods of time spanning two or more long-term transmission epochs.

26. The device of claim 25, wherein the transmitter transmits, in addition to each constant long-term value, one or more indications of a number of long-term transmission epochs over which associated long-term value remains constant.

27. The device of claim 25, wherein the transmitter transmits each of the constant long-term values in an associated initial message, and omits each of the constant long-term values in at least one subsequent message.

28. The device of claim 2, wherein the transmitter adaptively changes compression or encoding parameters for one or more sets of data elements.

29. The device of claim 28, wherein a quality metric is considered when adapting compression or encoding parameters, consisting of the following, individually or in combination:
  a. a fidelity with which data elements reconstituted from transmitted messages match original data elements,
  b. an ability of parametric models or other representations of data elements to mathematically estimate future values,
  c. a time that passes between when the receiver begins to receive data messages from the transmitter, and when the receiver has received a complete data message and begins decoding.

30. The device of claim 28, wherein the adaptive changes are applied such that the quality metric for data elements reconstituted by the receiver is maximized within a constraint upon allowable maximum average or instantaneous size of the messages.

31. The device of claim 28, wherein the adaptive changes are applied in order to minimize an average or instantaneous size of messages being transmitted by the transmitter while satisfying the quality metric for data elements reconstituted by the receiver.

32. The device of claim 28, wherein compressed message payload contents are selected so as to achieve a balance between message content, message payload size, and message transmission rates, in response to evolving trends in the data elements themselves.

33. The device of claim 2, wherein a data value that falls outside a range that can be represented within an associated current allocation of message payload in a current long-term, short-term, or residual message, or is otherwise anomalous, is accommodated by:
  a. an indication, within the message, that the data value is out of range, and
  b. utilization of a portion of the remaining message capacity to temporarily extend range of the value such that it can be represented, or
  c. an indication, within the message, that the data value is anomalous and thus cannot be represented, is corrupt, or is missing.

34. The device of claim 1, wherein one or more data elements are encrypted prior to encoding into messages.

35. The device of claim 1, wherein one or more messages are encrypted prior to transmission, or are transmitted via encrypted channels or media.

* * * * *